US010707893B2

(12) United States Patent
Tanio

(10) Patent No.: US 10,707,893 B2
(45) Date of Patent: Jul. 7, 2020

(54) SECOND-ORDER DELTA-SIGMA MODULATOR AND TRANSMISSION APPARATUS

(71) Applicant: NEC Corporation, Minato-ku, Tokyo (JP)

(72) Inventor: Masaaki Tanio, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 16/464,717

(22) PCT Filed: Dec. 1, 2017

(86) PCT No.: PCT/JP2017/043337
§ 371 (c)(1),
(2) Date: May 29, 2019

(87) PCT Pub. No.: WO2018/101467
PCT Pub. Date: Jun. 7, 2018

(65) Prior Publication Data
US 2019/0326924 A1 Oct. 24, 2019

(30) Foreign Application Priority Data

Dec. 2, 2016 (JP) ................................. 2016-234991

(51) Int. Cl.
*H03M 3/00* (2006.01)
*G06F 7/509* (2006.01)
(Continued)

(52) U.S. Cl.
CPC .......... *H03M 3/322* (2013.01); *G06F 7/5095* (2013.01); *G06F 7/544* (2013.01); *H03M 1/66* (2013.01); *H04L 27/12* (2013.01); *H04L 27/36* (2013.01)

(58) Field of Classification Search
CPC ...................................................... H03M 3/322
(Continued)

(56) References Cited

U.S. PATENT DOCUMENTS

| 5,485,415 A | 1/1996 | Kiji |
| 2016/0182082 A1* | 6/2016 | Tachimori ............. H03M 3/424 341/143 |
| 2017/0070237 A1* | 3/2017 | Ardalan ................ H03M 3/496 |

FOREIGN PATENT DOCUMENTS

| JP | 6-318149 A | 11/1994 |
| JP | 2011-77741 A | 4/2011 |

(Continued)

OTHER PUBLICATIONS

International Search Report in International Application No. PCT/JP2017/043337, dated Feb. 20, 2018.
(Continued)

*Primary Examiner* — Joseph Chang

(57) ABSTRACT

A second-order ΔΣ modulator includes a plurality of integrators and a parallel higher-bit processing part, and the parallel higher-bit processing part includes a plurality of addition and determination processing sections. The addition and determination processing section receives first and second carry inputs and first and second state inputs, and outputs a quantized output and first and second state outputs. A first selector selects one set from sets of the first and the second state outputs from the plurality of addition and determination processing sections and outputs the selected set, and a second selector selects one quantized output from the quantized outputs from the plurality of addition and determination processing sections. An output of the first selector is used as a selection control signal for the first and the second selectors.

20 Claims, 27 Drawing Sheets

(51) Int. Cl.
*G06F 7/544* (2006.01)
*H03M 1/66* (2006.01)
*H04L 27/12* (2006.01)
*H04L 27/36* (2006.01)

(58) Field of Classification Search
USPC .......................................... 332/120; 341/143
See application file for complete search history.

(56) References Cited

FOREIGN PATENT DOCUMENTS

| | | |
|---|---|---|
| JP | 2011-86983 A | 4/2011 |
| WO | 2017/037880 A1 | 3/2017 |

OTHER PUBLICATIONS

Ameya Bhide, et al., "An 8-GS/s 200-MHz Bandwidth 68-mW ΔΣ DAC in 65-nm CMOS", 2013, IEEE Transactions on Circuits and Systems—II—Express Briefs, vol. 60, No. 7, pp. 387-391 http://dx.doi.org/10.1109/TCSII.2013.2258272 (6 pages total).

Masaaki Tanio, et al., "An FPGA-based All-Digital Transmitter with 28-GHz Time-Interleaved Delta-Sigma Modulation", Microwave Symposium (IMS), 2016 IEEE MTT-S International, May 2016, pp. 1-4 (4 pages total).

* cited by examiner

FIG. 2D

| A<sub>IN</sub> | B<sub>IN</sub> | C<sub>IN</sub> | C<sub>OUT</sub> | S<sub>OUT</sub> |
|---|---|---|---|---|
| 0 | 0 | 0 | 0 | 0 |
| 0 | 0 | 1 | 0 | 1 |
| 0 | 1 | 0 | 0 | 1 |
| 0 | 1 | 1 | 1 | 0 |
| 1 | 0 | 0 | 0 | 1 |
| 1 | 0 | 1 | 1 | 0 |
| 1 | 1 | 0 | 1 | 0 |
| 1 | 1 | 1 | 1 | 1 |

SECOND-ORDER DELTA-SIGMA MODULATOR AND TRANSMISSION APPARATUS

This application is a National Stage Entry of PCT/JP2017/043337 filed on Dec. 1, 2017, which claims priority from Japanese Patent Application 2016-234991 filed on Dec. 2, 2016, the contents of all of which are incorporated herein by reference, in their entirety.

REFERENCE TO RELATED APPLICATION

The present invention is based upon and claims the benefit of the priority of Japanese patent application No. 2016-234991 filed on Dec. 2, 2016, the disclosure of which is incorporated herein in its entirety by reference thereto.

The present invention relates to a second-order delta-sigma modulator and transmission apparatus.

BACKGROUND

In wireless communication, it is required to utilize various frequency bands effectively, and accordingly, there is a demand for a wireless apparatus compatible with various frequencies. Regarding a transmitter, a 1-bit digital transmitter, in which an analog circuit only compatible with a fixed frequency is replaced with a digital circuit independent of frequency, has been studied.

As a related technology, Non-Patent Literature 1 describes a technology related to a delta sigma Digital-to-Analog Converter ($\Delta\Sigma$ DAC) used in a modulator of a 1-bit digital transmitter.

In recent years, carrier frequency has shifted to a high frequency band in wireless communication, and a demand for delta sigma ($\Delta\Sigma$) modulation to operate at high speed (high-speed bit rate) has been increasing accordingly. An operating frequency of a $\Delta\Sigma$ modulator is, for instance, at most, twice a carrier frequency in case of low-pass $\Delta\Sigma$ modulation, the same as a carrier frequency in case of envelope $\Delta\Sigma$ modulation, and in general, it is proportional to a carrier frequency regardless of a $\Delta\Sigma$ modulation scheme.

Regarding high-speed operation of first-order $\Delta\Sigma$ modulation, an arrangement that achieves high-speed operation by eliminating, for instance, carry propagation delay using pipeline processing is known as disclosed in Non-Patent Document 1. FIG. 1, which is taken from FIG. 5 of Non-Patent Document 1, illustrates a first-order two-channel interleaved MASH (multi-stage noise shaping) stage. Each MASH consists of five pipeline stages of 2-bit integrators and one 3-bit forward pipeline stage. Each 2-bit integrator pipeline uses four 1-bit carry select adders. Adders A1 and A2 form Integrator 0, while Adders A3 and A4 form Integrator 1. A flip-flop FF is a D flip-flop that samples a value of a data terminal D at a rising edge (falling edge of a complementary clock clk⁻) of a clock signal clk and outputs a result from an output terminal Q. A NOR gate outputs a fixed High level when a reset signal rst supplied to one of input terminals is at a Low level, and outputs an inverted a value of the other input terminal when the reset signal rst is at a High level.

Non-Patent Literature 2 discloses a technology related to a 1-bit digital transmitter, an operation frequency of which is confirmed up to 28 GHz (Giga Hertz), in an FPGA (Field-Programmable Gate Array) using combination of a high-speed scheme such as time-interleaved configuration.

[Non-Patent Literature 1]
Ameya Bhide, Omid Esmailzadeh Najari, Behzad Mesgarzadeh, and Atila Alvandpour, "An 8-GS/s 200-MHz Bandwidth 68-mW $\Delta\Sigma$ DAC in 65-nm CMOS", IEEE TRANSACTIONS ON CIRCUITS AND SYSTEMS-II: EXPRESS BRIEFS, vol. 60, no. 7, pp. 387-391, Jul. 2013.

[Non-Patent Literature 2]
Masaaki Tanio, Shinichi Hori, Noriaki Tawa, Tomoyuki Yamase, and Kazuaki Kunihiro, "An FPGA-based All-Digital Transmitter with 28-GHz Time-Interleaved Delta-Sigma Modulation", IEEE IMS Symp, pp. 1-4, May 2016.

SUMMARY

Since noise suppression function in a vicinity of a desired signal is in principle low in a first-order $\Delta\Sigma$ modulation, there is a limit to broadening a signal bandwidth. Regarding a signal of a wide bandwidth of 100 MHz (Mega Hertz) or more to be used in a future, in order to achieve a good signal-to-noise ratio, a higher-order $\Delta\Sigma$ modulation not less than second-order is desired.

However, at present, it is difficult to achieve second-order or higher $\Delta\Sigma$ modulation.

The reason for this is that, in the second-order or higher $\Delta\Sigma$ modulation, even if a pipeline configuration is applied as in the first-order $\Delta\Sigma$ modulation, an operation block (higher-bit processing part) of multi-bit addition/subtraction and sign determination remains in high-order bits as described later and it is impossible to avoid a decrease in operating speed due to a carry propagation delay caused by this operation.

The present invention was invented to solve the problem above, and it is an object thereof to provide a second-order $\Delta\Sigma$ modulator capable of avoiding a decrease in operating speed and a transmission apparatus comprising the same.

According to an aspect of the present invention, a second-order delta-sigma modulator comprises at least
a first accumulator that receives an input bit signal;
a second accumulator that receives a sum bit output of the first accumulator;
a parallel higher-bit processing part that receives, as first and second carry inputs, first and second carry outputs outputted from the first and the second accumulators, and outputs a quantized output, wherein
the parallel higher-bit processing part comprises:
first to M-th (M is an integer not less than 2) addition and determination processing sections, each of which receives the first and the second carry inputs and first and second state inputs, and outputs a quantized output and first and second state outputs;
a first selector that receives M sets of the first and the second state outputs outputted from the first to the M-th addition and determination processing sections, selects a set from the M sets of the first and the second state outputs based on a control signal, and outputs the set selected; and
a second selector that receives M quantized outputs outputted from the first to the M-th addition and determination processing sections, selects one quantized output from the M quantized outputs based on the control signal and outputs the quantized output selected,
the output of the first selector being used as the control signal in the first and the second selectors.

According to another aspect of the present invention, there is provided a transmission apparatus comprising the second-order $\Delta\Sigma$ modulator according to the above aspect of the invention.

According to the present invention, it becomes possible to provide a second-order $\Delta\Sigma$ modulator and transmission apparatus capable of avoiding a decrease in operating speed. Still other features and advantages of the present invention will become readily apparent to those skilled in this art from the following detailed description in conjunction with the accompanying drawings where only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 2D is a diagram showing a truth table of a full adder.

DETAILED DESCRIPTION

Example embodiments of the present invention will be described. According to an aspect of the present invention, a second-order ΔΣ modulator uses a plurality of integrators and a parallel higher-bit processing part. The integrators are constituted by adders, and each integrator has a hierarchical structure in which an output of one stage serves as an input of an upper stage thereof. Further, an output of the top integrator becomes an input of the parallel higher-bit processing part.

According to another aspect of the present invention, a transmitter comprises the second-order ΔΣ modulator described above.

According to yet another aspect of the present invention, the parallel higher-bit processing part comprises a plurality of addition and determination processing sections and first and second selectors. The addition and determination processing sections receive a first state input, a second state input, a first carry input and a second carry input, and output a quantized output, a first state output and a second state output. While each of the values of the first and the second carry inputs supplied to the plurality of addition and determination processing sections is the same, a set of values of the first and the second state inputs are different from each other. Each of the first and the second state outputs obtained from these calculations is supplied to a first selector. Each of the quantized outputs is fed to a second selector. The first and the second selectors select a signal from a plurality of input signals based on a control signal and output the selected signal. The output of the first selector obtained in the previous operation is used as the control signal.

According to yet another aspect of the present invention, the addition and determination processing section comprises a sign determination unit, a first adder, and a second adder. The addition and determination processing section receives first and the second state inputs and first and the second carry inputs, and outputs first and second state outputs and a quantized output. The first adder receives a first carry input and a first state input as inputs thereof, adds all the received values, and outputs a result as the first state output. The second adder receives a second carry input and a second state input as inputs thereof, adds all the received values, and outputs a result as the second state output. The sign determination unit receives one of the results obtained in the above processes of calculation, determines a sign of the value thereof, and outputs a result as a quantized output.

In the following, first, a difficulty of increasing an operating speed of second-or higher-order ΔΣ modulation, described as technical problem, will be described using a comparative example, and then example embodiments which solves the above problem will be described.

Figure 2A:
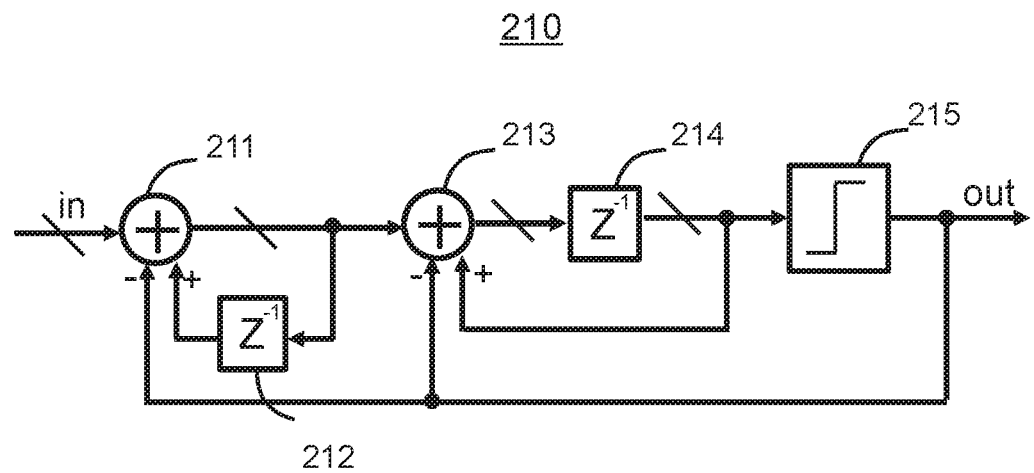
FIG. 2A is a diagram illustrating a second-order ΔΣ modulator.

FIG. 2A is a signal flow diagram of a second-order ΔΣ modulator 210. 211 and 213 denote first and second adders, 212 and 214 first and second delay elements, and 215 sign determination unit. The first adder 211 and the first delay element 212 constitute a first integrator (transfer function=$1/(1-Z^{-1})$). The second adder 213 and the second delay element 214 constitute a second integrator (transfer function=$Z^{-1}/(1-Z^{-1})$). Assuming that values of input in (multi-bit parallel input) and output out (1-bit serial output) are $X_{in}$ and $X_{out}$, the output of the first adder 211 is given as $$(X_{in}-X_{out}) \times 1/(1-Z^{-1}), \text{ and}$$

the output of the second delay element 214 is given as $$\{(X_{in}-X_{out}) \times 1/(1-Z^{-1})-X_{out}\} \times Z^{-1}/(1-Z^{-1}).$$

Assuming that a quantization noise of the sign determination unit 215 is E, from $$\{(X_{in}-X_{out}) \times 1/(1-Z^{-1})-X_{out}\} \times Z^{-1}/(1-Z^{-1})+E=X_{out},$$

$X_{out}$ is given $$X_{out}=Z^{-1}X_{in}+(1-Z^{-1})^2 E.$$

Figure 2B:
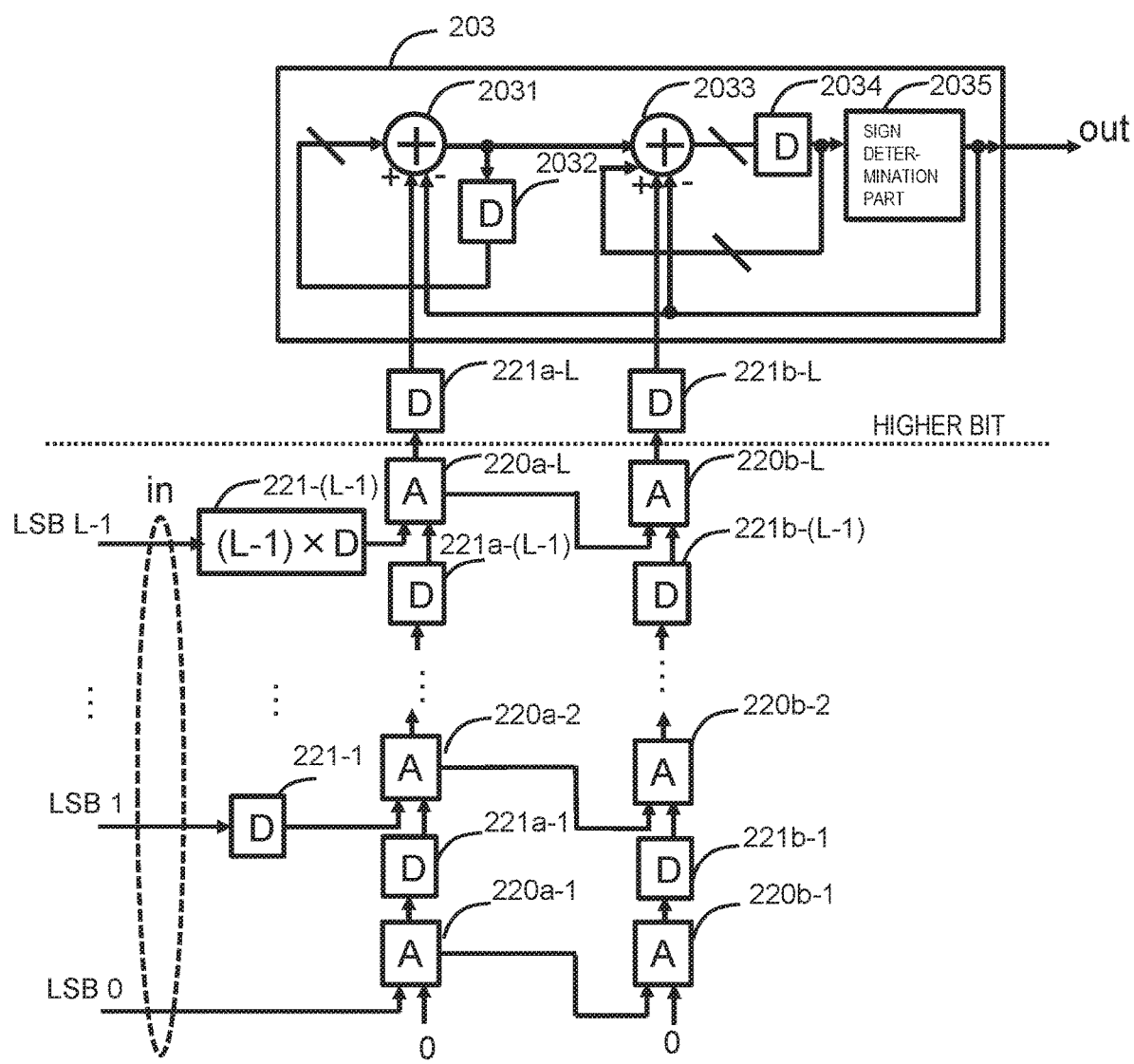
FIG. 2B is a diagram illustrating a comparative example of the configuration of a second-order ΔΣ modulator.

FIG. 2B is a diagram illustrating an arrangement example (comparative example) of FIG. 2A. An input in of the second-order ΔΣ modulator is parallel L bits (LSB (Least Significant Bit) 0, LSB 1 to LSB L−1). A first group of accumulators 220a-i (i=1, ..., L), a second group of accumulators 220b-i (i=1, ..., L), a higher-bit processing part 203, delays 221a-i and 221b-i (i=1, ..., L) and delay elements 221-j (j=1, ..., L−1) are provided. Out of the first group accumulators 220a-i (i=1, ..., L), the accumulator 220a-1 receives an input bit signal LSB 0, and the accumulators 220a-i (i=2, ..., L) receive bit signals output from delay elements 221-(i−1) which delay input bit signals LSB i−1 by (i−1) times a unit delay time D. Zero is fed to a carry input of the accumulator 220a-1. Carry outputs of the accumulators 220a-i (i=1, ..., L−1) are fed to carry inputs of the accumulators 220a-(i+1) (i=1, ..., L−1) of the next stage via the delay elements 221a-i (i=1, ..., L−1). A carry output of the accumulator 220a-L is supplied to the higher-bit processing part 203 as a first carry input via the delay element 221a-L. Sum bits output from the first group accumulators 220a-i (i=1, ..., L) are fed to the second group accumulators 220b-i (i=1, ..., L), respectively. Zero is fed to a carry input of the accumulator 220b-1. Carry outputs of the accumulators 220b-i (i=1, ..., L−1) are fed to carry inputs of the accumulators 220b-(i+1) (i=1, ..., L−1) of the next stage via the delay elements 221b-i (i=1, ..., L−1). A carry output of the accumulator 220b-L is supplied to the higher-bit processing part 203 as a second carry input via the delay element 221b-L.

Figure 2C:
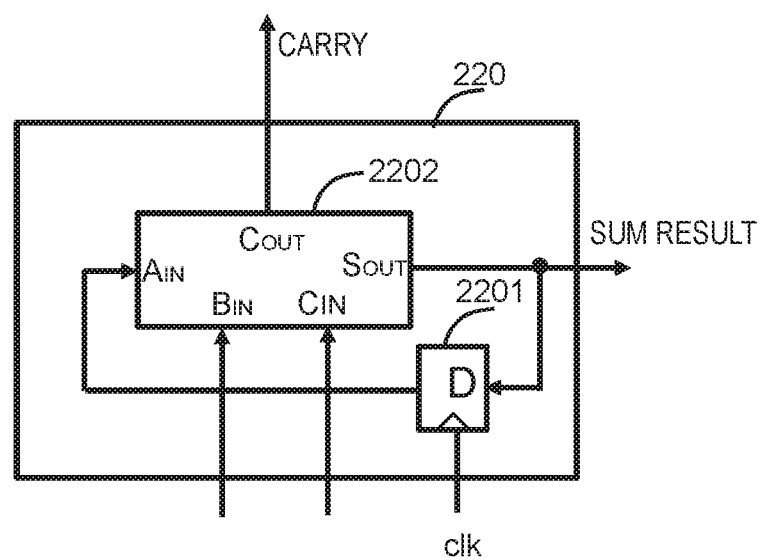
FIG. 2C is a diagram illustrating an arrangement example of an accumulator in FIG. 2B.

Each of the first and second group accumulators 220a-i and 220b-i (i=1, ..., L) has an identical configuration (refer to FIG. 2C). As illustrated in FIG. 2C, the accumulator 220 includes a full adder (FA) 2202 and a D flip-flop 2201. The full adder 2202 has as input terminals, 1-bit $A_{IN}$ and $B_{IN}$ terminals, and a $C_{IN}$ terminal that receives a carry from a preceding stage. The full adder 2202 has, output terminals, an $S_{OUT}$ terminal that outputs an addition result (sum bit) and a $C_{OUT}$ terminal that outputs a carry. Note that, in the full adder 2202, either of the two input terminals may be $A_{IN}$ or $B_{IN}$ (the two terminals are indistinguishable, and the names are given for the sake of convenience). FIG. 2D is a truth table explaining the operation of the full adder 2202. The addition result (1 bit) outputted from the output terminal $S_{OUT}$ of the full adder 2202 is outputted as an addition result of the accumulator 220 and is further supplied to a data terminal of the D flip-flop 2201. The D flip-flop 2201 supplies the addition result (1 bit) to the input terminal $A_{IN}$ of the full adder 2202 in synchronization with, for instance, a rising edge of a clock signal clk. The accumulator 220 constitutes an integrator including an adder and a delay inserted between an output terminal and an input terminal of the adder.

With reference to FIGS. 2B and 2C, in the first group accumulators 220a-i (i=1, ..., L), the output terminals $S_{OUT}$ of the full adders 2202 are connected to the input terminals $A_{IN}$ of the full adders 2202 via the D flip-flops 2201 and also to the input terminals $B_{IN}$ of the full adders 2202 in the second group accumulators 220b-i (i=1, ..., L). In the second group accumulators 220b-i (i=1, ..., L), the output terminals $S_{OUT}$ of the full adders 2202 are connected to the input terminals $A_{IN}$ of the full adders 2202 via the D flip-flops 2201, but they are not connected to an outside of the accumulators 220b-i (i=1, ..., L).

In FIG. 2B, the delay element 221-1 and the D flip-flop 221a-1 supply a signal obtained by delaying LSB 1 by the unit delay time D in synchronization with a rising edge of a clock signal and the carry output of the accumulator 220a-1 to the input terminal $B_{IN}$ and the carry input terminal $C_{IN}$ of the full adder (2202 in FIG. 2C) of accumulator 220a-2, respectively. Further, an addition result (1 bit) of the accumulator 220a-2 and a carry output of the accumulator 220b-1 from the D flip-flop 221b-1 are supplied to the input terminal $B_{IN}$ and the carry input terminal $C_{IN}$ of the full adder (2202 in FIG. 2C) of the accumulator 220b-2, respectively.

LSB L−1 is delayed by the delay element 221-(L−1) by a delay time (L−1)×D, and then supplied to the input terminal $B_{IN}$ and the carry input terminal $C_{IN}$ of the full adder (2202 in FIG. 2C) of the accumulator 220a-L along with the output from the D flip-flop 221a-(L−1). The output of the accumulator 220a-L and the output of the D flip-flop 221b-(L−1) are supplied to the accumulator 220b-L.

The carry outputs of the accumulator 220a-L and the accumulator 220b-L (1 bit each; first and second carries) are supplied to the D flip-flops 221a-L and 221b-L, respectively, and fed to first and second adders 2031 and 2033 of the higher-bit processing part 203 in synchronization with, for instance, a rising edge of the clock signal.

In the higher-bit processing part 203, the first adder 2031 and a unit delay element (D flip-flop) 2032 constitute a first integrator, and the second adder 2033 and a unit delay element (D flip-flop) 2034 constitute a second integrator. The first adder 2031 receives an output of the D flip-flop 2032, an output (first carry) of the D flip-flop 221a-L, and an output out of a sign determination unit 2035, and outputs a value obtained by subtracting an output out of the sign determination unit 2035 from a sum of the output of the D flip-flop 2032 and the output (first carry) of the D flip-flop 221a-L. The second adder 2033 receives an output of the D flip-flop 2034, an output (second carry) of the D flip-flop 221b-L, and the output out of the sign determination unit 2035, and outputs a value obtained by subtracting the output out of the sign determination unit 2035 from a sum of the output of the D flip-flop 2034 and the output (second carry) of the D flip-flop 221b-L. The sign determination unit 2035 receives an output of the D flip-flop 2034, determines a value of a sign bit (most significant bit), and outputs a determination result (binary) as Out. For instance, an offset binary code indicates a positive value when the most significant bit is 1, while a two's complement representation indicates a negative value when the most significant bit is 1.

Figure 1:
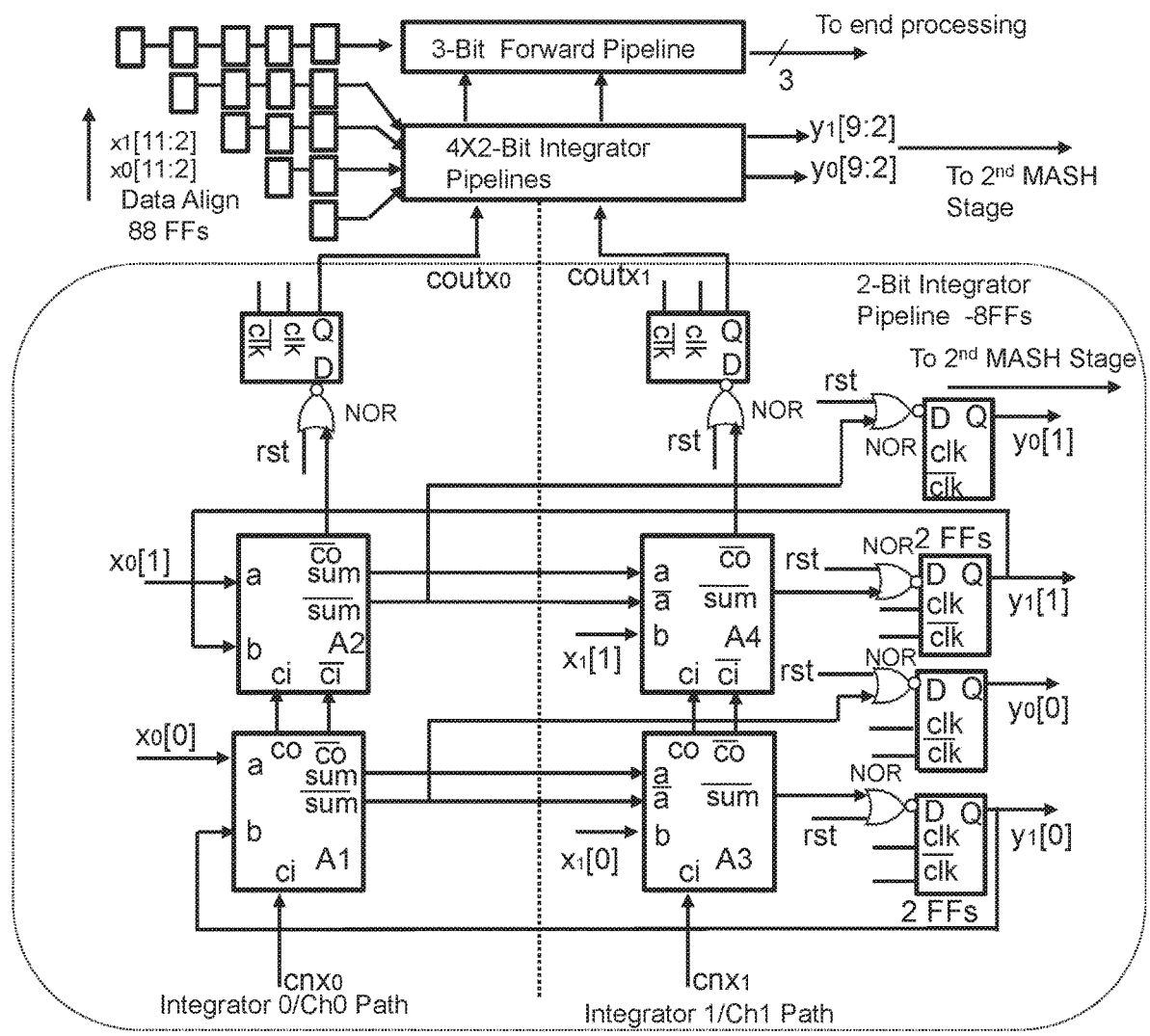
FIG. 1 is a diagram taken from FIG. 5 of Non-Patent Literature 1.

Even if the pipeline configuration as illustrated in FIG. 1 is applied to the configuration of FIG. 2B, since the higher-bit processing part 203 performs multi-bit addition/subtraction and sign determination operations, it is not possible to avoid a decrease in operating speed due to a carry propagation delay caused by this operation.

Each of example embodiments described below solves this problem. The example embodiments will be described below with reference to the drawings.

Example Embodiment

Transmitter

Figure 3:
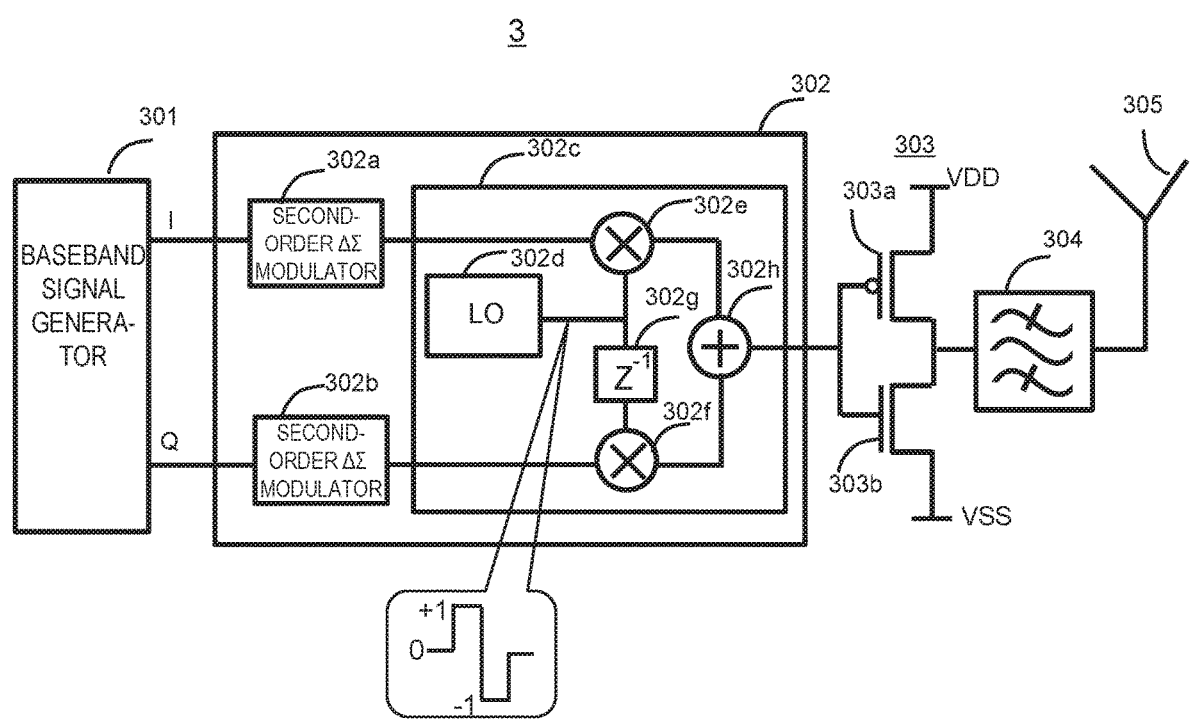
FIG. 3 is a diagram illustrating an arrangement example of a transmitter of an example embodiment.

FIG. 3 is a diagram illustrating an arrangement of a transmitter relating to an example embodiment of the present invention. With reference to FIG. 3, the transmitter 3 includes a baseband signal generator 301, a 1-bit modulator 302, a class-D power amplifier 303, a band-pass filter 304, and an antenna 305.

An output of the baseband signal generator 301 is connected to the 1-bit modulator 302. An output of the 1-bit modulator 302 is connected to an input of the class-D power amplifier 303.

The class-D power amplifier is a switching mode power amplifier and includes a pair of switch elements 303a and 303b, and the band-pass filter 304 as an output circuit thereof. An output of the band-pass filter 304 is connected to the antenna 305. When one of the pair of switch elements 303a and 303b is ON, the other is OFF. The switch element 303a is constituted by, for instance, a P-channel FET (Field Effect Transistor) having a source connected to a power supply VDD, a gate connected to an input, and a drain connected to an output. The switch element 303b is constituted by an N-channel FET having a source connected to a power supply VSS, a gate connected to an input, and a drain connected to an output. Further, it may be configured such that a pair of FETs have the same polarity, and a driving voltage is supplied to each gate so as to perform a switching operation in which, when one of the FETs is ON, the other is OFF. Further, the pair of the switch elements 303a and 303b may be constituted by a bipolar element with a transformer-coupled circuit as an input stage of the pair of switch elements.

The band-pass filter 304 is constituted by, for instance, an analog filter circuit (a series circuit of an inductance (L) and a capacitance (C)) (tuned circuit). When the band-pass filter 304 is tuned to a switching frequency (basic frequency: carrier frequency f) of the pair of the switch elements 303a and 303b (reactance component=0), the switching frequency is passed therethrough and harmonic components of the switching frequency are removed. The switch elements 303a and 303b outputs a rectangular wave, and a fundamental frequency component of the rectangular wave is applied to a load connected to an output of the band-pass filter 304. Since harmonic components are negligible, a sinusoidal current flows through the load (antenna 305). Further, though an efficiency of the class-D power amplifier is ideally 100 percent, the efficiency decreases due to on-resistance of the FETs and a switching time.

The baseband signal generator 301 generates a baseband signal from an in-phase signal (I signal) and a quadrature signal (Q signal) that is 90 degrees out of phase with the I signal. The baseband signal generator 301 transmits the generated I and Q signals to the 1-bit modulator 302.

The 1-bit modulator 302 receives the I and Q signals from the baseband signal generator 301. The 1-bit modulator 302 performs second-order $\Delta\Sigma$ modulation on the received I and Q signals in second-order $\Delta\Sigma$ modulators 302a and 302b, and supplies a binary serial signal to a digital quadrature modulation part 302c.

The digital quadrature modulation part 302c digitally up-converts the frequency of each of the output signals (for instance, a binary value of +1 and −1) from the second-order $\Delta\Sigma$ modulators 302a and 302b. A local oscillator 302d is driven at, for instance, a frequency obtained by multiplying a carrier frequency fc by four to generate a 4×fc local oscillation signal. The local oscillation signal has a waveform pattern of 4 cycles of 0, +1, 0, and −1 (a waveform pattern of four cycles of one time period=1/(4×fc)) constitute one time period (=1/fc)). A mixer (digital multiplier) 302e digitally multiplies the local oscillation signal and the I signal (carrier frequency) (the multiplication result is a ternary value of −1, 0, and 1). A mixer (digital multiplier) 302f digitally multiplies the Q signal and a signal obtained by shifting the local oscillation signal by 90 degrees with a phase shifter 302g (the multiplication result is a ternary value of −1, 0, and 1). Further, a delay ($Z^{-1}$) of the phase shifter 302g delays the local oscillation signal by 1/(4×fc) (=90 degrees). An adder 302h adds the output I of the mixer 302e and the output Q of the mixer 302f. The addition result is a binary value of −1 and 1. (When the output I of the mixer 302e is a value of 0, the output Q of the mixer 302f is either −1 or 1 and the addition result is −1 or 1. When the output Q of the mixer 302f is a value of 0, the output I of the mixer 302e is either −1 or 1 and the addition result is −1 or 1.) The binary pulse train (1 cycle=carrier frequency fc) from the adder 302h of the 1-bit modulator 302 is supplied to the input of the class-D power amplifier 303.

The class-D power amplifier 303 receives the binary pulse train from the 1-bit modulator 302, and outputs a pattern obtained by inverting the received binary pulse train. The class-D power amplifier 303 transmits the amplified binary pulse train to the band-pass filter 304.

The band-pass filter 304 receives a binary pulse train outputted from the class-D power amplifier 303, removes low frequency components and high frequency components other than a desired band (near the carrier frequency fc) included in the binary pulse train, and generates an RF (Radio Frequency) signal of the carrier frequency fc. The RF signal of the carrier frequency fc generated by the band-pass filter 304 is transmitted to the antenna 305. The antenna 305 propagates the RF signal of the carrier frequency fc transmitted from the band-pass filter 304 into air.

Several example embodiments of the second-order $\Delta\Sigma$ modulators 302a and 302b used in the transmitter 3 of FIG. 3 will be described below.

First Example Embodiment

Second-Order $\Delta\Sigma$ Modulator

In a first example embodiment of the present invention, an operation scheme of the second-order $\Delta\Sigma$ modulators 302a and 302b follows the scheme shown in FIG. 2A.

Figure 4A:
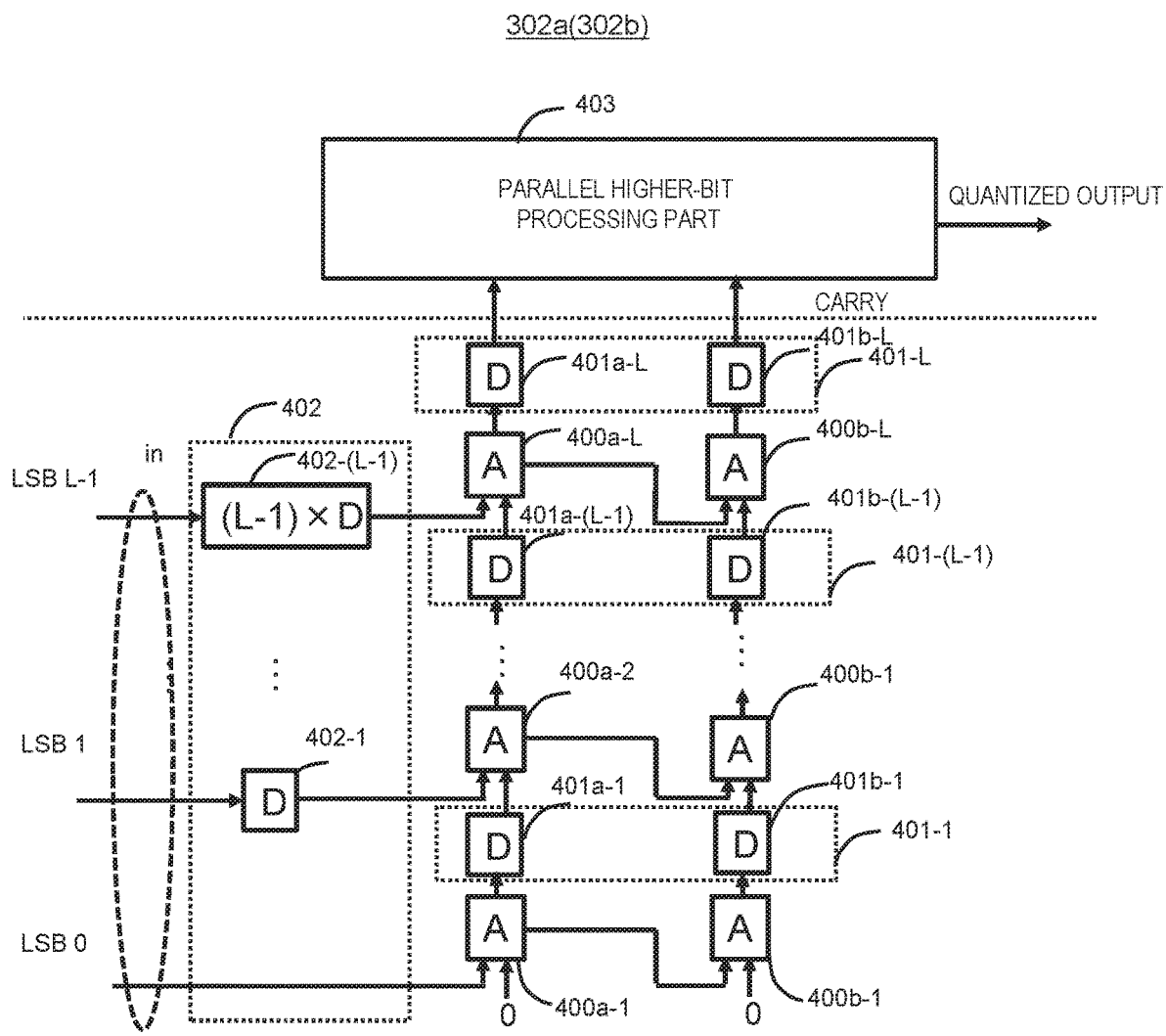
FIG. 4A is a diagram illustrating an arrangement example of a second-order ΔΣ modulator of an example embodiment.

FIG. 4A is a diagram illustrating an arrangement example of the second-order $\Delta\Sigma$ modulators 302a and 302b in the transmitter 3 of FIG. 3. The second-order $\Delta\Sigma$ modulators 302a and 302b are configured identically and each thereof includes L number of accumulators 400a-1 to L (first group accumulators), L number of accumulators 400b-1 to L (second group accumulators), delay parts 401-$i$ ($i$=1, ..., L) constituted by delay elements 401a-$i$ and 401b-$i$ that delay each output of accumulators 400a-$i$ and 400b-$i$ ($i$=1, ..., L) by the unit time D, an input delay adjustment part 402 constituted by delay elements 402-($j$−1) ($j$=2, ..., L) that delay input bit signals LSB ($j$−1) ($j$=2, ..., L) by ($j$−1) times the unit time D, and a parallel higher-bit processing part 403.

Note that the configuration in FIG. 4A is obtained by replacing the higher-bit processing part 203 with the parallel higher-bit processing part 403 in the configuration in FIG. 2A. In other words, out of the first group accumulators, the accumulator 400a-1 receives the input bit signal LSB 0, and the accumulators 400a-i (i=2, . . . , L) receive bit signals obtained by having the delay elements 402-(i−1) delay the input bit signals LSB i−1 by (i−1) times the unit delay time D. Zero is fed to a carry input of the accumulator 400a-1. Carry outputs of the accumulators 400a-i (i=1, . . . , L−1) are supplied to carry inputs of the accumulators 400a-(i+1) (i=1, . . . , L−1) of a next stage via the delay elements 401a-i (i=1, . . . , L−1). A carry output of the accumulator 400a-L is supplied to the parallel higher-bit processing part 403 as a first carry input via the delay element 401a-L. Sum bits outputted from the first group accumulators 400a-i (i=1, . . . , L) are fed to the second group accumulators 400b-i (i=1, . . . , L), respectively. Zero is fed to a carry input of the accumulator 400b-1. Carry outputs of the accumulators 400b-i (i=1, . . . , L−1) are fed to carry inputs of the accumulators 400b-(i+1) (i=1, . . . , L−1) of the next stage via the delay elements 401b-i (i=1, . . . , L−1). A carry output of the accumulator 400b-L is supplied to the parallel higher-bit processing part 403 as a second carry input via the delay element 401b-L.

Figure 4B:
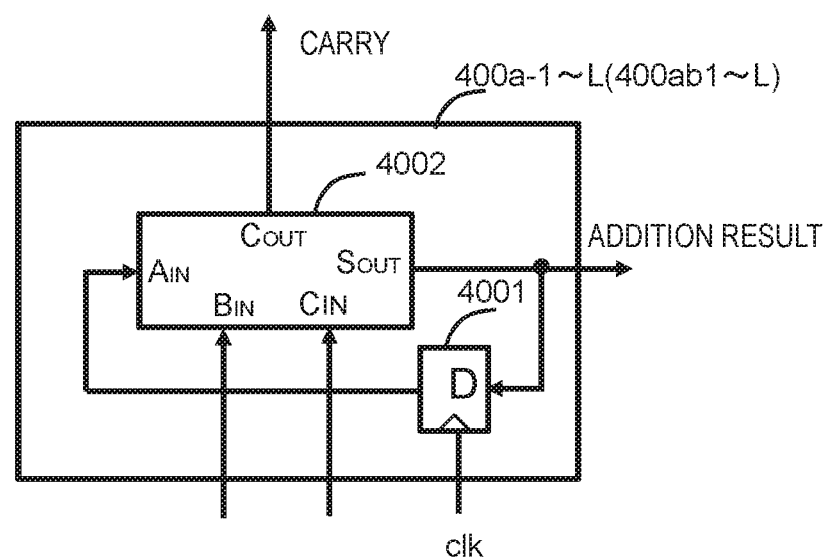
FIG. 4B is a diagram illustrating an arrangement example of a accumulator of an example embodiment.

Each of the first and second group accumulators 400a-i and 400b-i (i=1, . . . , L) is configured identically (refer to FIG. 4B). As illustrated in FIG. 4B, each of the accumulators 400a-i and 400b-i (i=1, . . . , L) is constituted by a full adder (FA) 4002 and a delay (D) 4001. The delay elements 401a-i and 401b-i (i=1, . . . , L) in FIG. 4A and the delay 4001 in FIG. 4B are constituted by a D flip-flop that outputs a signal supplied to, for instance, a data terminal in synchronization with the clock signal.

The full adder 4002 includes input terminals $A_{IN}$, $B_{IN}$, and $C_{IN}$ as in FIG. 2C. $A_{IN}$ receives a sum bit output from an output terminal $S_{OUT}$ of the full adder 4002, which is delayed by the delay (D flip flop) 4001. The input terminal $B_{IN}$ receives an input signal (1 bit). The carry input terminal $C_{IN}$ receives a carry bit signal. The operation of the full adder 4002 is the same as FIG. 2D.

In the first group accumulators 400a-i (i=1, . . . , L), the output terminals $S_{OUT}$ of the full adders 4002 are connected to the input terminals $A_{IN}$ of the full adders 4002 via the D flip-flops 4001 and also to the input terminals $B_{IN}$ of the full adders 4002 in the second group accumulators 400b-i (i=1, . . . , L). Meanwhile, in the second group accumulators 400b-i (i=1, . . . , L), the output terminals $S_{OUT}$ of the full adders 4002 are connected to the input terminals $A_{IN}$ of the full adders 4002 via the D flip-flops 4001, but they are not connected to the outside of the accumulators 400b-i (i=1, . . . , L).

The operation of the second-order ΔΣ modulators 302a and 302b in FIG. 4A will be described below.

In FIG. 4A, after adjusting the delay amount of each digit of an L-bit input signal (input signal having a bit width of L), the input delay adjustment part 402 supplies resultant signals to the corresponding accumulators 400a-1 to 400a-L. Sum bits outputted from the accumulators 400a-1 to L are fed to the accumulators 400b-1 to L, respectively.

Carry bits outputted from the accumulator 400a-1 to L−1 are supplied to the upper accumulators 400a-2 to L via the unit delay elements 401a-1 to L−1, respectively. A carry outputs of the uppermost accumulator 400a-L is fed to the parallel higher-bit processing part 403 via the unit delay 401a-L. Zero is always supplied to the carry input $C_{IN}$ of the full adder 4002 of the lowest accumulator 400a-1.

Carry bits outputted from the accumulator 400b-1 to L are supplied to the upper accumulators 400b-2 to L via the unit delay elements 401b-1 to L−1, respectively. A carry output of the uppermost accumulator 400b-L is fed to the parallel higher-bit processing part 403 via the unit delay 401b-L. Zero is always supplied to the carry input $C_{IN}$ of the full adder 4002 of the lowest accumulator 400b-1. Outputs of the carry signals of the accumulators 400a-1 to L and the accumulators 400b-1 to L are delayed according to the delay amounts set by the delay parts 401-1 to L and fed to the upper (next-stage) accumulators. As a result, a propagation delay due to a carry operation is invalidated and high-speed operation becomes possible.

In the L delay parts 401-1 to L in FIG. 4A, a delay between the accumulators corresponds to that of one D flip-flop, but the delay time (the number of D flip-flops) is not particularly limited thereto. Further, although a high-speed operation may be hindered, the delay may be zero. The delay amounts of the delay parts 401-1 to L are closely related to the input delay adjustment part 402, and a delay of each digit (LSB 0 to LSB L−1) in the input delay adjustment part 402 is set so that delay amounts of the delay parts 401-1 to L and the input signal are synchronized.

Note that a value of the L-bit input signal takes an offset binary format without a negative sign in order to conform to the configuration of the accumulators described above. The input signal, however, is not limited to the offset binary format, and a format having a negative sign is also conceivable. In such a case, signals to the accumulators 400a-1 to 400a-L are received in offset binary format once, and subtraction of an offset at the input from the first carry input value is always subtracted.

The parallel higher-bit processing part 403 receives carry outputs of the accumulators 400a-L and 400b-L as the first and the second carry inputs and outputs a 1-bit quantized output.

Figure 5:
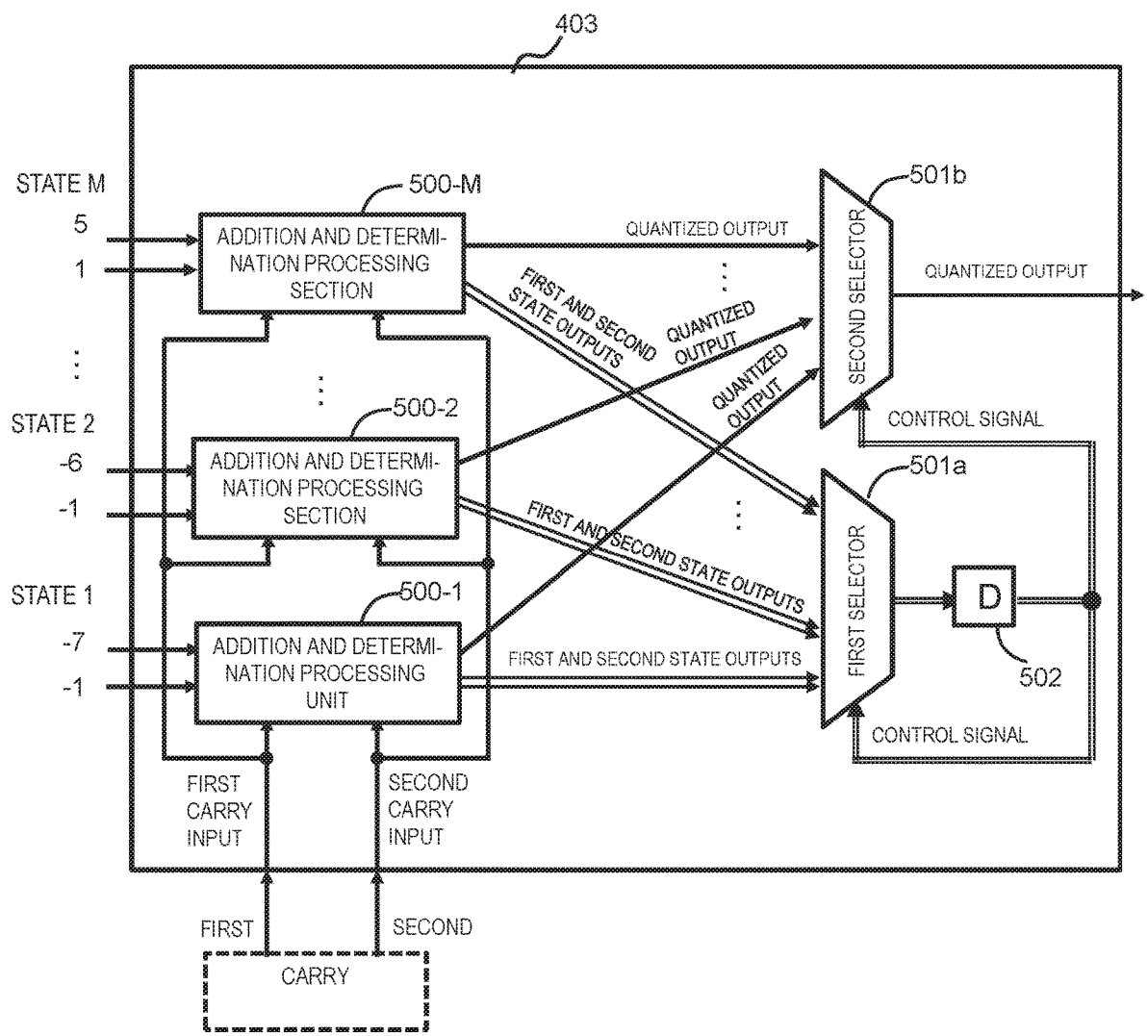
FIG. 5 is a diagram illustrating an arrangement example of a parallel higher-bit processing part of an example embodiment.

FIG. 5 is a diagram illustrating an arrangement example of the parallel higher-bit processing part 403 of FIG. 4A. With reference to FIG. 5, the parallel higher-bit processing part 403 includes first to M-th addition and determination processing sections 500-1 to M, a first selector 501a, a second selector 501b, and a delay element 502. Further, the "first" and the "second" from "carry" surrounded by a dashed line in FIG. 5 denote the first and the second carry outputs from the accumulators 400a-L and 400b-L, respectively, via the delay element 401a-L and the delay element 401b-L in FIG. 4A. The parallel higher-bit processing part 403 receives the first carry output and the second carry output as the first carry input and the second carry input.

Each of the first to the M-th addition and determination processing sections 500-1 to M receives
the first carry input,
the second carry input,
a first state input, and
a second state input.

As a result of performing addition and determination processing internally, each of the first to the M-th addition and determination processing sections 500-1 to M outputs
the quantized output,
a first state output, and
a second state output.

Further, the first and the second carries from accumulators 400a-L and 400b-L in FIG. 4A, are commonly supplied to the first and the second carry inputs in the first to the M-th addition and determination processing sections 500-1 to M via the delay elements 401a-L and 401b-L.

A set of values of the first and the second state inputs fed to the first to the M-th addition and determination processing sections 500-1 to M are set so that M addition and determination processing sections 500-1 to M receive different values from each other.

The first and the second state outputs from each of the first to the M-th addition and determination processing sections 500-1 to M are supplied to the first selector 501*a*.

The quantized output from each of the first to the M-th addition and determination processing sections 500-1 to M is supplied to the second selector 501*b*.

The first selector 501*a* selects and outputs one set from a plurality of sets of the input signals (M sets of the first and the second state outputs) based on a control signal (selection control signal).

The second selector 501*b* selects and outputs one signal from a plurality of the input signals (M quantized outputs) based on a control signal (selection control signal).

The control signal for the first and the second selectors 501*a* and 501*b*, is a signal outputted by the delay element 502 which delays the output signal from the first selector 501*a* (the first and the second state outputs of the set selected by the first selector 501*a*) by one clock. The delay element 502 is realized by, for instance, a delay such as a D flip-flop (D-FF).

The first selector 501*a*, the second selector 501*b*, and the delay element 502 operate with a clock having the same frequency as a desired bit rate of the quantized output.

Regarding the addition and determination processing sections 500-1 to M arranged in front of the first selector 501*a* and the second selector 501*b*, the operating frequency (or operating cycle) is not specified. For instance, an operation time of the first to the M-th addition and determination processing sections 500-1 to M does not have to be within the same cycle as the bit rate of the quantized output. For instance, the first to the M-th addition and determination processing sections 500-1 to M may have a D flip-flop inserted there within, or may use a clock obtained by dividing a clock frequency of a desired bit rate of the quantized output.

Based on the first and the second state outputs from the first to the M-th addition and determination processing sections 500-1 to M, it is determined later which set has the correct values as M sets of state inputs. As a result, the first and the second selectors 501*a* and 501*b* are able to continue to select the quantized output and the state output obtained from the correct state inputs. Consequently, a result of the correct quantized output is obtained at a desired bit rate.

Figure 6:
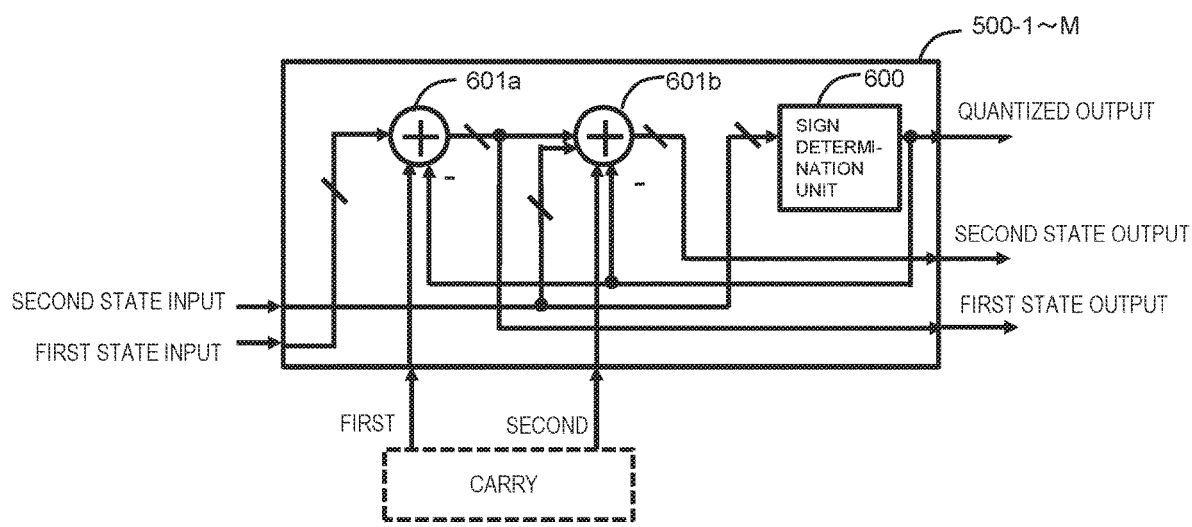
FIG. 6 is a diagram illustrating a addition and determination processing section of an example embodiment.

FIG. 6 is a diagram illustrating the first to the M-th addition and determination processing sections 500-1 to M in FIG. 5. The addition and determination processing sections 500-1 to M includes a first adder 601*a*, a second adder 602*b*, and a sign determination unit 600. The sign determination unit 600 receives the second state input, determines a sign of the value thereof, and serially outputs a determination result (binary) as a quantized output.

The first adder 601*a* receives the first state input, the first carry input, and the output of the sign determination unit 600, performs sum and difference calculation (addition and subtraction) thereon:

(the first state input)+(the first carry input)−(the output of the sign determination unit 600), and outputs a calculation result as a first state output while supplying the first state output to the second adder 601*b* as an input thereof.

The second adder 601*b* receives the second state input, the second carry input, the output (calculation result) of the first adder 601*a*, and the output of the sign determination unit 600, performs sum and difference calculation (addition and subtraction) thereon:

(the second state input)+(the second carry input)+ (the output of the first adder 601a)−(the output of the sign determination unit 600), and outputs a calculation result as a second state output. The output of the sign determination unit 600 fed as a negative value to the first adder 601*a* and the second adder 601*b* may be supplied in two's complement representation, and the first and the second adders 601*a* and 601*b* may perform addition operation on the output of the sign determination unit 600.

It is noted that in FIG. 6, regarding values of the first and the second state inputs and how sets of these values (M sets) are determined, there is no description. The following describes a principle of how the values of the first and the second state inputs are derived in the first to the M-th addition and determination processing sections 500-1 to M.

Figure 7A:
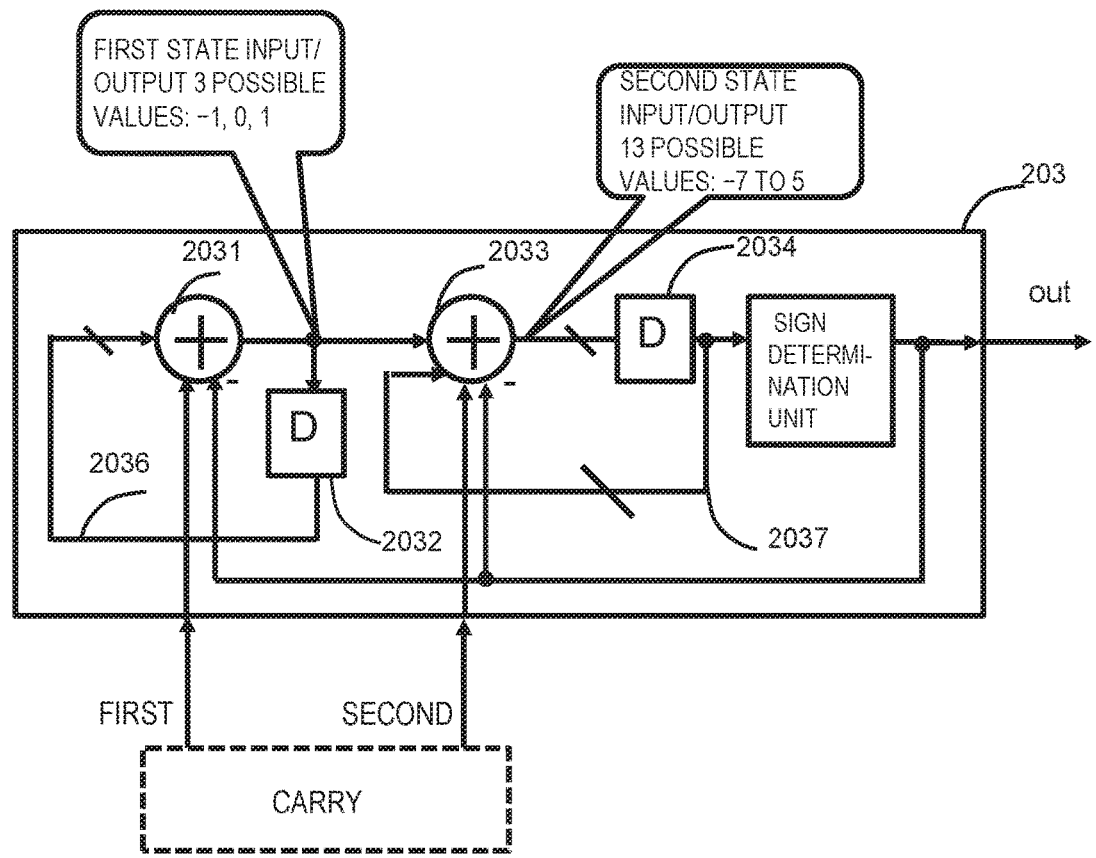
FIG. 7A is a diagram illustrating a higher-bit processing part of the comparative example.

FIG. 7A is a diagram illustrating the higher-bit processing part 203 (incapable of high-speed operation since it does not perform parallel processing) described as the comparative example with reference to FIG. 2B. With reference to FIG. 7A, the values of the first and the second state inputs in the arrangement of FIG. 6 are derived by dividing feedback paths including delays in the configuration of the higher-bit processing part 203.

In the addition and determination processing sections 500-1 to M in FIG. 6, a feedback path 2036 from the output of the adder 2031 to the input of the adder 2031 in FIG. 7A is divided into the first state input to the adder 601*a* and the first state output from the adder 601*a*. Further, in the addition and determination processing sections 500-1 to M in FIG. 6, the delay element 2032 in FIG. 7A is eliminated.

In the addition and determination processing sections 500-1 to M in FIG. 6, a feedback path 2037 from the output of the adder 2033 to the input of the adder 2033 in FIG. 7A is divided into the second state input to the adder 601*b* and the second state output from the adder 601*b*. Further, in the addition and determination processing sections 500-1 to M in FIG. 6, the delay element 2034 in FIG. 7A is eliminated.

Thus, in FIG. 6, the first state input and the first state output match an output result of the adder 2031 of FIG. 7A.

Further, in FIG. 6, the second state input and the second state output match an output result of the adder 2033 of FIG. 7A.

From above, in the arrangement of FIG. 6, by using a simulation, possible values of the first state input and the first state output, the second state input and the second state output, and relevant nodes are checked. Then, all sets of possible values of possible values of the first state input and the first state output, the second state input and the second state output, and relevant nodes are used as the first state input and the second state input of the first to the M-th addition and determination processing sections 500-1 to M.

Thus, it becomes possible to cover all possible operations in the higher-bit processing part 203 of FIG. 7A. In FIG. 6, there are three possible values, −1, 0, and +1, regarding the first state input to the adder 601*a* and the first state output from the adder 601*a*, and there are 13 possible values, −7 to +5, regarding the second state input to the adder 601*b* and the second state output from the adder 601*b*. These results are shown as the first state input/output and the second state input/output over the higher-bit processing part 203 in FIG. 7A.

In FIG. 5, by having the first and the second selectors 501a and 501b continue to select correct state inputs, it becomes possible to obtain the quantized output at high speed.

Figure 7B:
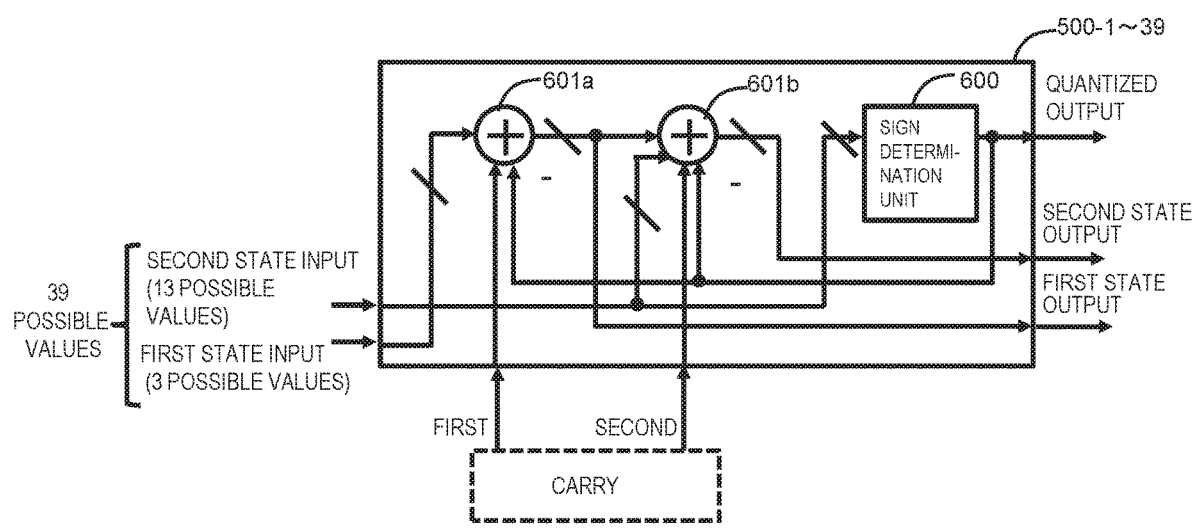
FIG. 7B is a diagram illustrating an example of a parallel higher-bit processing part of an example embodiment.

FIG. 7B is a diagram illustrating a specific example of the addition and determination processing sections 500-1 to M in FIG. 6. There are three possible values, −1, 0, and +1, of the first state input and output, and 13 possible values, integer values in a range of −7 to +5, of the second state input and output. Therefore, a set M of state inputs in the addition and determination processing sections 500-1 to M is M=3×13=39. High-speed operation is achieved by using 39 addition and determination processing sections 500-1 to 39.

Figure 8:
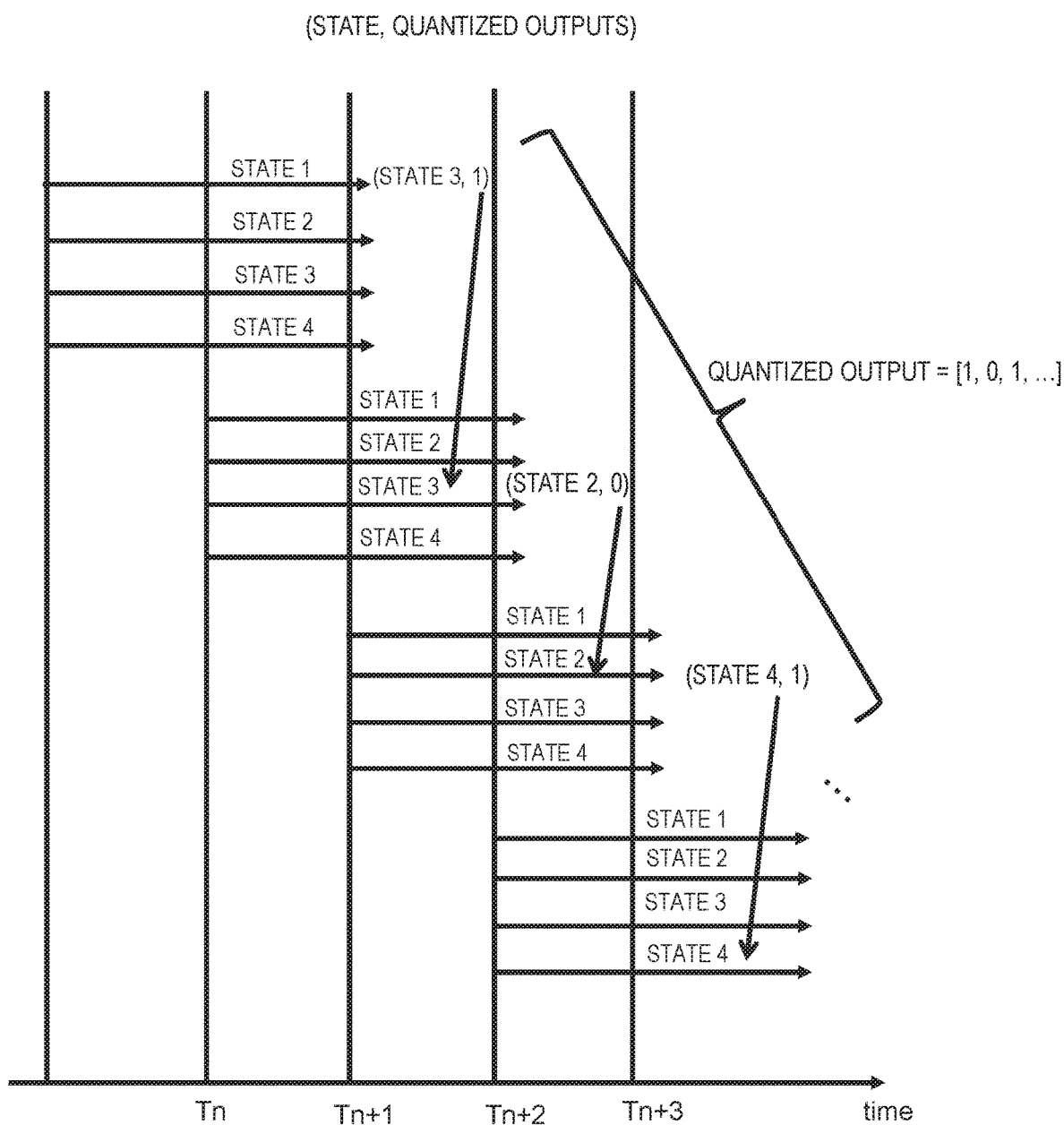
FIG. 8 is a diagram illustrating an operation of an addition and determination processing section of an example embodiment.

FIG. 8 is a diagram illustrating an operation of the addition and determination processing sections 500-1 to M in FIG. 6. In order to simplify the description, the number M of state inputs is assumed to be 4. Further, at the start, state 1 is assumed to be a correct state (the state 1 is known to be correct as a state input at the beginning).

In a first clock cycle, calculation by the addition and determination processing sections 500-1 to 4 corresponding to the four state inputs starts, and without waiting for a result, the calculation by the addition and determination processing sections 500-1 to 4 corresponding to next four state inputs is performed in a second clock cycle.

During the above parallel operation, at a clock cycle $T_n$, the addition and determination processing sections 500-1 to M obtain an output result corresponding to the calculation of the state 1 started in the first clock cycle, and it is assumed that the output result is the state 3 and the quantized output is 1.

At this time, 1 is directly outputted as the quantized output, and further, it is set so set that a result of the calculation corresponding to the state 3 is selected as an output result of the addition and determination processing sections 500-1 to M corresponding to the four state inputs, calculation of which is started in the second clock cycle. By performing these processes sequentially, the result of the quantized output is obtained at every clock cycle, independent of the calculation time of the addition and determination processing sections 500-1 to M.

Second-Order ΔΣ Modulator of Second Example Embodiment

The second-order ΔΣ modulator 302a (302b) of the first example embodiment described above is based on the configuration of FIG. 2A. A second-order ΔΣ modulator different from that in FIG. 2A has the addition and determination processing sections 500-1 to M, illustrated in FIG. 6, configured differently. A modification of the addition and determination processing sections 500-1 to M will be described as a second example embodiment.

Figure 9:
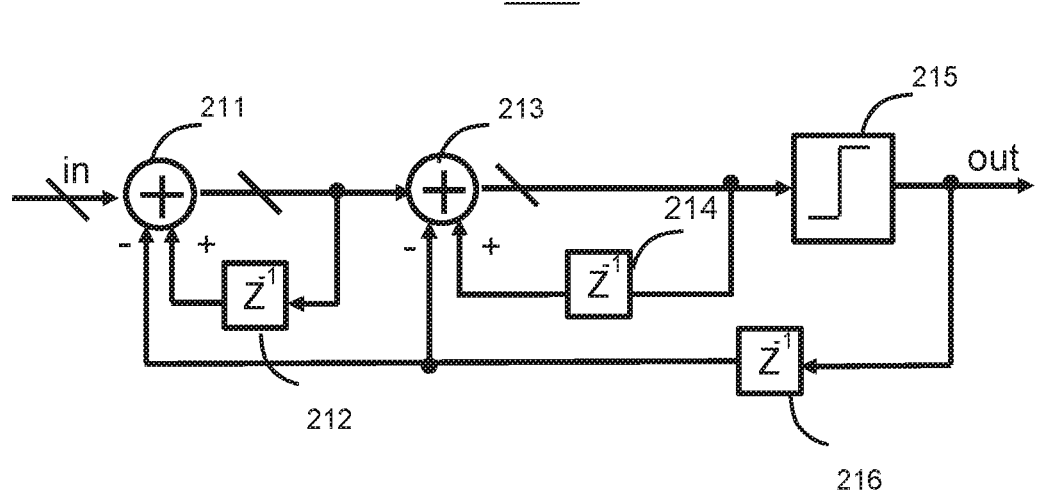
FIG. 9 is a diagram illustrating another example of a second-order ΔΣ modulator.

FIG. 9 is a diagram illustrating one of basic configurations of a well-known second-order ΔΣ modulator. The second-order ΔΣ modulator 210A in FIG. 9 differs from the second-order ΔΣ modulator 210 in FIG. 2A in that the second-order ΔΣ modulator 210A can obtain a quantized output (out) from an input signal (in) without delay. That is to say, the second-order ΔΣ modulator 210A does not have the delay element 214 in FIG. 2A inserted between the second adder 213 and the sign determination unit 215. The delay element 214 is inserted between the connection point of the output of the second adder 213 and the input of the sign determination unit 215 and the input of the adder 213. Further, in FIG. 9, a signal output from a delay element 216 which delays the output of the sign determination unit 215 is supplied to the first adder 211 and the second adder 213. Assuming that a values of the input in (multi-bit parallel input) and an output out (1-bit serial output) are $X_{in}$ and $X_{out}$ and a quantization noise of the sign determination unit 215 is E, the following equation is given.

$$X_{out}=X_{in}+(1-Z^{-1})^2 E.$$

The second-order ΔΣ modulator corresponding to the configuration of FIG. 9 is configured as illustrated in FIG. 4A of the first example embodiment, and the parallel higher-bit processing part 403 of the second example embodiment is configured as illustrated in FIG. 5 of the first example embodiment. It is noted that the first to the M-th addition and determination processing sections 500-1 to M in FIG. 5 in the second-order ΔΣ modulator corresponding to the configuration of FIG. 9 are configured differently from FIG. 6.

Figure 10A:
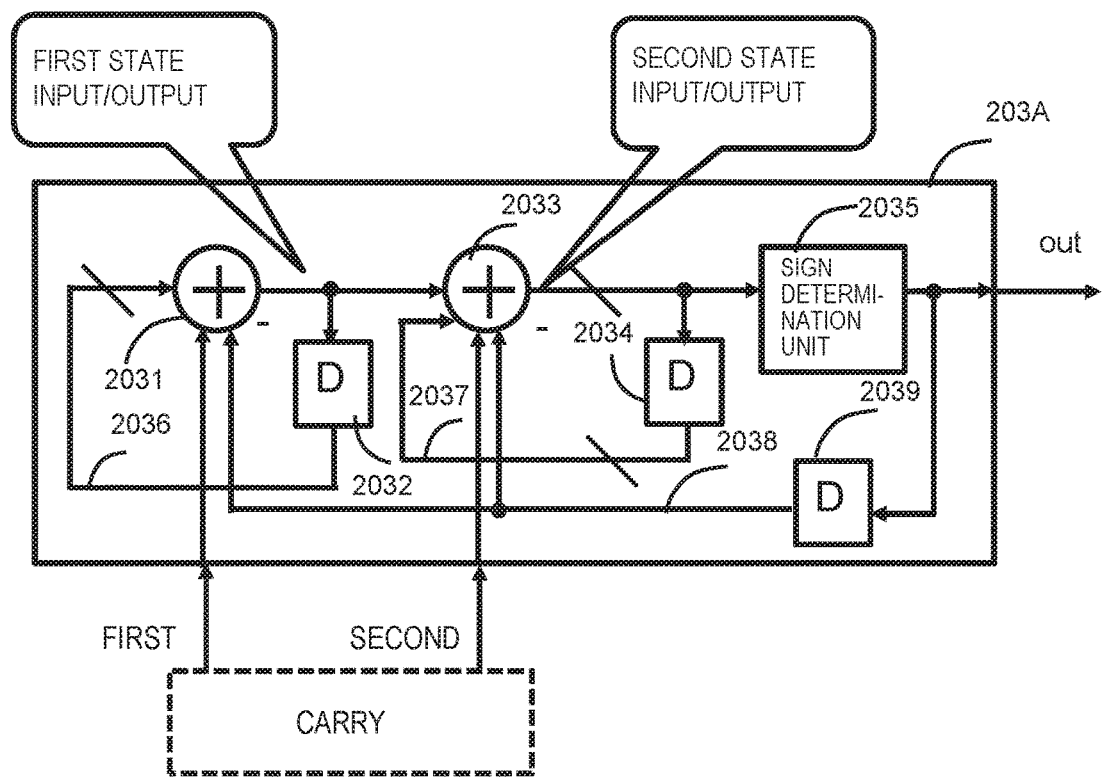
FIG. 10A is a diagram illustrating a higher-bit processing part of the comparative example.

FIG. 10A is a diagram illustrating a modification of the higher-bit processing part 203 of the comparative example corresponding to the configuration of FIG. 9. A higher-bit processing part 203A has a D flip-flop 2039 inserted in a feedback path 2038 from the output of the sign determination unit 2035 to the input of the adder 2031.

Figure 10B:
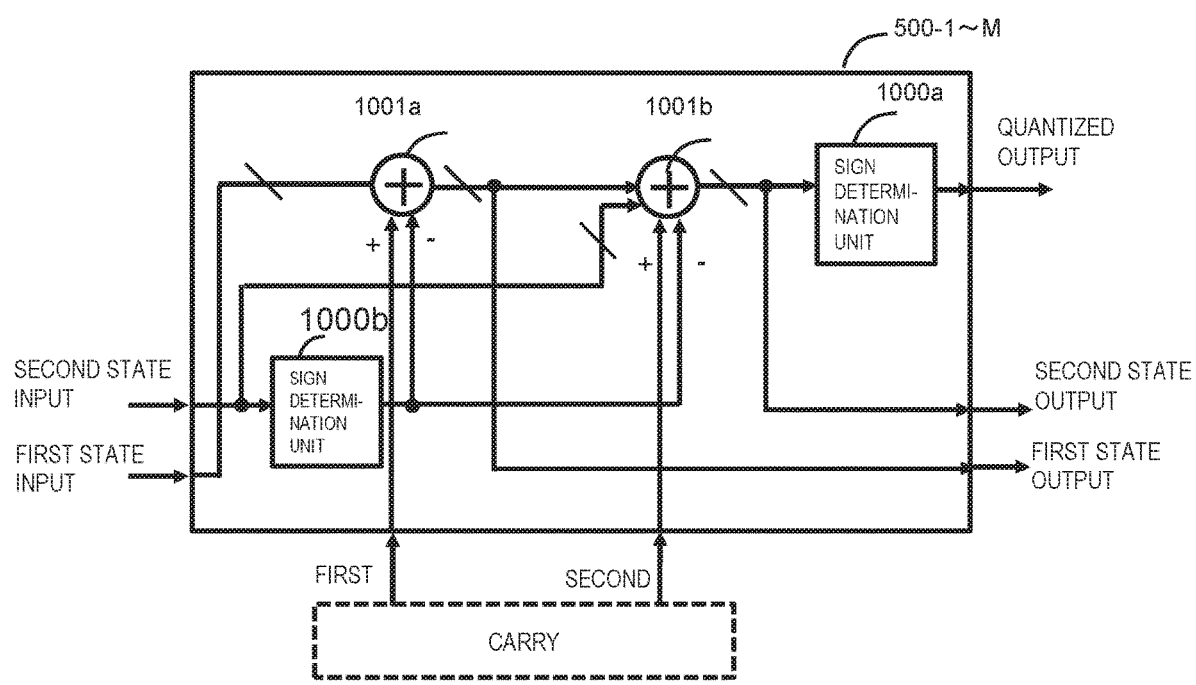
FIG. 10B is a diagram illustrating an addition and determination processing section of a second example embodiment.

The first to the M-th addition and determination processing sections 500-1 to M illustrated in FIG. 10B are derived by dividing feedback paths including delays in FIG. 10A.

In each of the first to the M-th addition and determination processing sections 500-1 to M, the feedback path 2036 from an output of the adder 2031 to an input of the adder 2031 in FIG. 10A is divided into a first state input to an adder 1001a and a first state output from the adder 1001a. Further, in FIG. 10B, the delay element 2032 in FIG. 10A is eliminated.

Further, in each of the first to the M-th addition and determination processing sections 500-1 to M, the feedback path 2037 from an output of the adder 2033 to an input of the adder 2033 in FIG. 10A is divided into a second state input to a second adder 1001b and a second state output from the adder 1001b. Further, in FIG. 10B, the delay element 2034 in FIG. 10A is eliminated.

In each of the first to the M-th addition and determination processing sections 500-1 to M, a sign determination unit 1000b is provided between a second state input and an input (−) of the second adder 1001b. The sign determination unit 1000b receives a second state input and supplies a sign determination result (1 bit) of the second state input to the input (−) of the second adder 1001b.

Each of the first to the M-th addition and determination processing sections 500-1 to M includes a first sign determination unit 1000a, the second sign determination unit 1000b, the first adder 1001a, and the second adder 1001b. The second sign determination unit 1000b receives the second state input, determines a sign of the value thereof, and outputs a result to the first and the second adders 1001a and 1001b.

In each of the first to the M-th addition and determination processing sections 500-1 to M, the first adder 1001a receives a first state input, a first carry input, and an output of the first sign determination unit 1000a, performs sum and difference calculation, and outputs a result thereof to the first state output and an input of the second adder 1001b.

In each of the first to the M-th addition and determination processing sections 500-1 to M, the second adder 1001b receives the output of the first adder 1001a, the second state input, a second carry input, and the output of the first sign determination unit 1000a, performs sum and difference calculation, and outputs a result thereof as the second state output and an input of the first sign determination unit 1000a. The first sign determination unit 1000a receives an output of the second adder 1001b, determines a sign of the value thereof, and outputs a result as a quantized output.

Further, a policy how to determine the values of the first state input and the second state input are determined in the first to the M-th addition and determination processing sections 500-1 to M will be described below.

In the second example embodiment, the first to the M-th addition and determination processing sections 500-1 to M are derived by dividing feedback paths including delays in the higher-bit processing part 203A in FIG. 10A.

As in the first example embodiment, sets of possible values of the first state input/output and the second state input/output in the configuration of FIG. 10A are checked using predetermined simulation, and then sets of values of the first and the second state inputs are determined so as to cover these possible values.

Variation of the Second-Order ΔΣ Modulator

Figure 11:
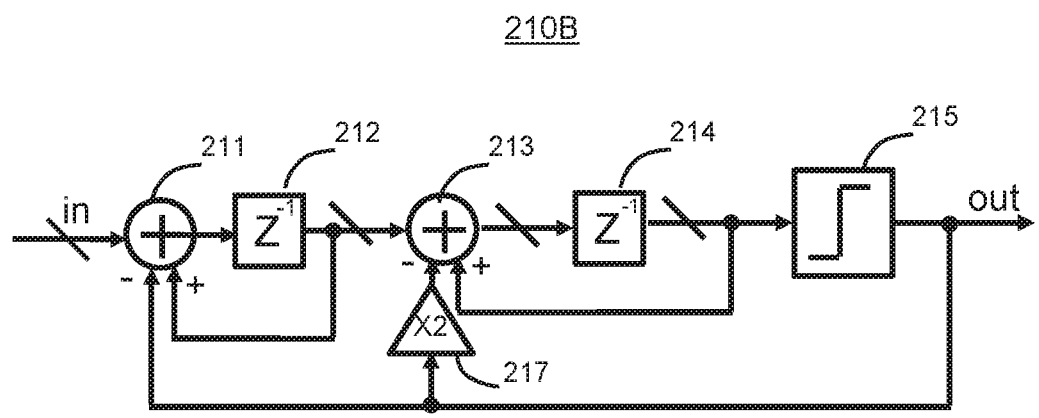
FIG. 11 is a diagram illustrating another example of a second-order ΔΣ modulator.

Further, as an arrangement of the second-order ΔΣ modulator, in addition to FIG. 2A and FIG. 9, one illustrated in FIG. 11 is known. The second-order ΔΣ modulator in FIG. 11 has the delay element 212 in FIG. 2A inserted between an output of the first adder 211 and an input of the second adder 213, an output of the sign determination unit 215 is fed to the first adder 211, and a value obtained by doubling the output of the sign determination unit 215 is supplied to an input of the second adder 213. Assuming that the values of the input in (multi-bit parallel input) and the output out (1-bit serial output) are $X_{in}$ and $X_{out}$ and the quantization noise of the sign determination unit 215 is E, the following equation is given.

$$X_{out}=(Z^{-1})^2 X_{in}+(1-Z^{-1})^2 E.$$

Figure 12A:
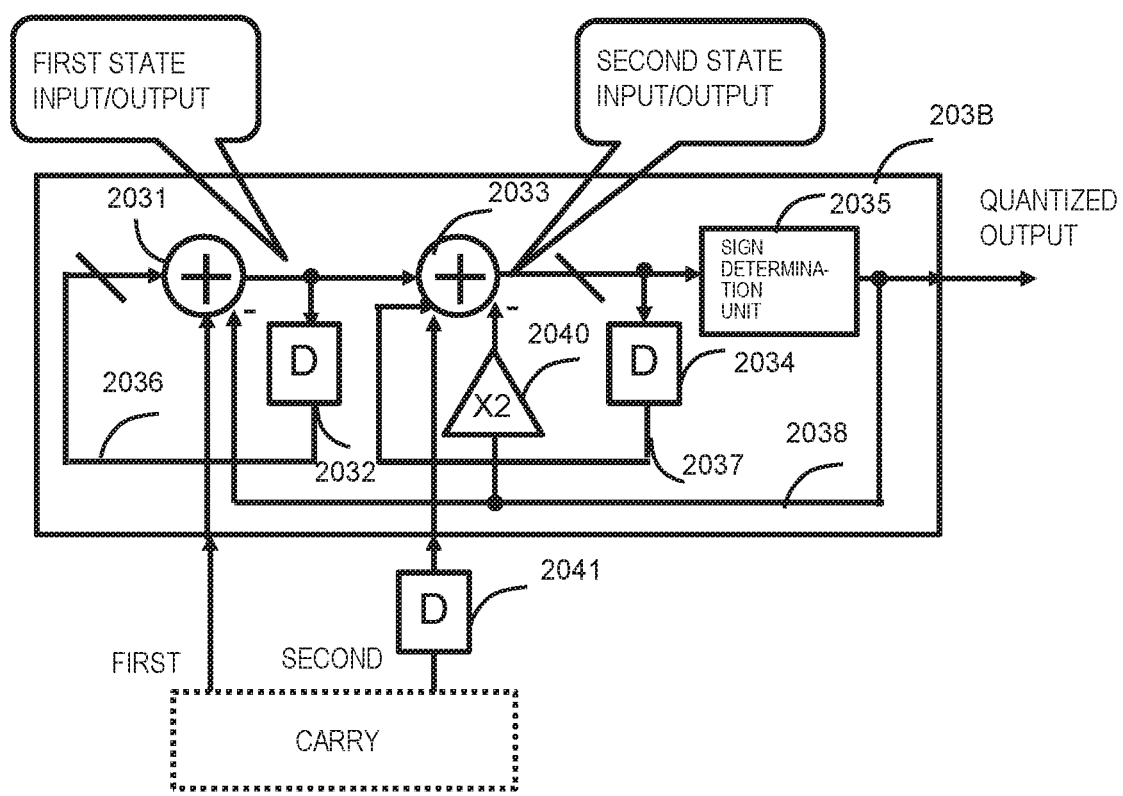
FIG. 12A is a diagram illustrating a parallel higher-bit processing part.

FIG. 12A is a diagram illustrating a modification of the higher-bit processing part 203 of the comparative example corresponding to the configuration of FIG. 11. A higher-bit processing part 203B has a doubling circuit 2040 inserted in the feedback path 2038 from the output of the sign determination unit 2035 to the input of the adder 2033. The doubling circuit 2040 may be constituted by a shifter that performs 1-bit left shifting. The second carry input is delayed by one clock by a delay element 2041 and supplied to a negative input of the adder 2033. This delay element 2041 causes the output of the adder 2033 delayed by the delay element 2034 and the second carry input to be supplied to the adder 2033 at the same timing.

Figure 12B:
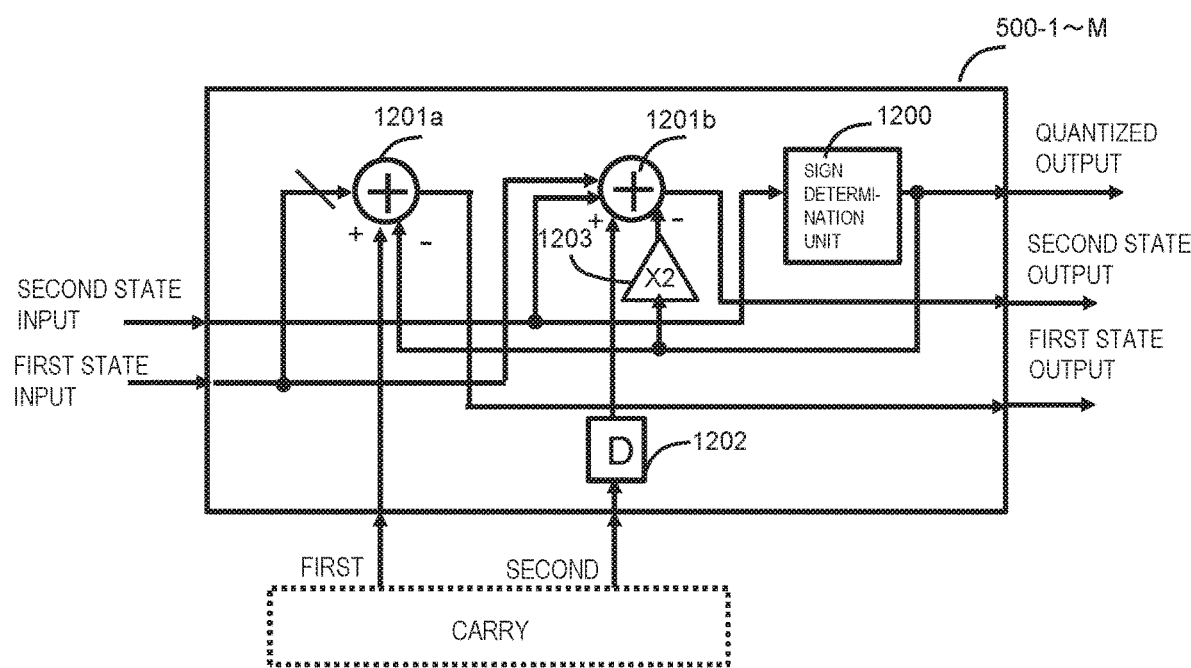
FIG. 12B is a diagram illustrating a higher-bit processing part of the comparative example.

FIG. 12B is a diagram illustrating the configuration of the first to the M-th addition and determination processing sections 500-1 to M corresponding to FIG. 11. The first to the M-th addition and determination processing sections 500-1 to M are constituted by a sign determination unit 1200, a first adder 1201a, a second adder 1201b, and a delay element 1202.

The sign determination unit 1200 receives the second state input, determines a sign of the value thereof, and outputs a result as a quantized output. The first adder 1201a receives the first state input, the first carry input, and an output of the sign determination unit 1200, performs sum and difference calculation thereon, and outputs a result as the first state output.

The second adder 1201b receives the first state input, the second carry input delayed by the delay element 1202, and a value outputted from a doubling circuit 1203 that doubles the output of the sign determination unit 1200, performs sum and difference calculation thereon, and outputs a result as the second state output.

In each of the first to the M-th addition and determination processing sections 500-1 to M in FIG. 12B, a feedback path 2036 from an output of the adder 2031 to an input of the adder 2031 in FIG. 12A is divided into the first state input to the first adder 1201a and the first state output from the first adder 1201a. In FIG. 12B, the delay element 2032 of FIG. 12A is eliminated.

Further, in each of the first to the M-th addition and determination processing sections 500-1 to M in FIG. 12B, a feedback path 2037 from an output of the second adder 2033 to an input of the second adder 2033 in FIG. 12A is divided into the second state input to the second adder 1201b and the second state output from the second adder 1201b. Further, in FIG. 12B, the delay element 2034 of FIG. 12A is eliminated.

In each of the first to the M-th addition and determination processing sections 500-1 to M, the delay element 1202 is inserted between the second carry input and the input of the second adder 1201b.

The sign determination unit 1200 is provided between the second state input and the input (−) of the second adder 1201b. The sign determination unit 1200 receives the second state input and supplies a result (1 bit) of determination of a sign of the second state input to the input (−) of the second adder 1201b.

How the values of the first state input and the second state input are determined in the addition and determination processing sections 500-1 to M illustrated in FIG. 12B will be described below. As in the first example embodiment, sets of possible values of the first state input/output and the second state input/output in the configuration of FIG. 12A are simulated and checked in advance, and then sets of values of the first and the second state inputs are determined so as to cover these possible values.

Further, the configuration of the second-order ΔΣ modulator is, as a matter of course, not limited to those illustrated in FIGS. 2A, 9 and 11. The addition and determination processing sections can be derived by performing the same modification in other configurations of the second-order ΔΣ modulator, and the present embodiment is also applicable to these configurations.

In the first and the second example embodiments, it becomes possible to apply time-interleaving to achieve high-speed operation overall with suppression of an operating speed of main operational blocks, i.e., the accumulators 400a-1 to L and 400b-1 to L and the parallel higher-bit processing part 403 (refer to Non-Patent Literatures 1 and 2).

Third Example Embodiment

Figure 13:
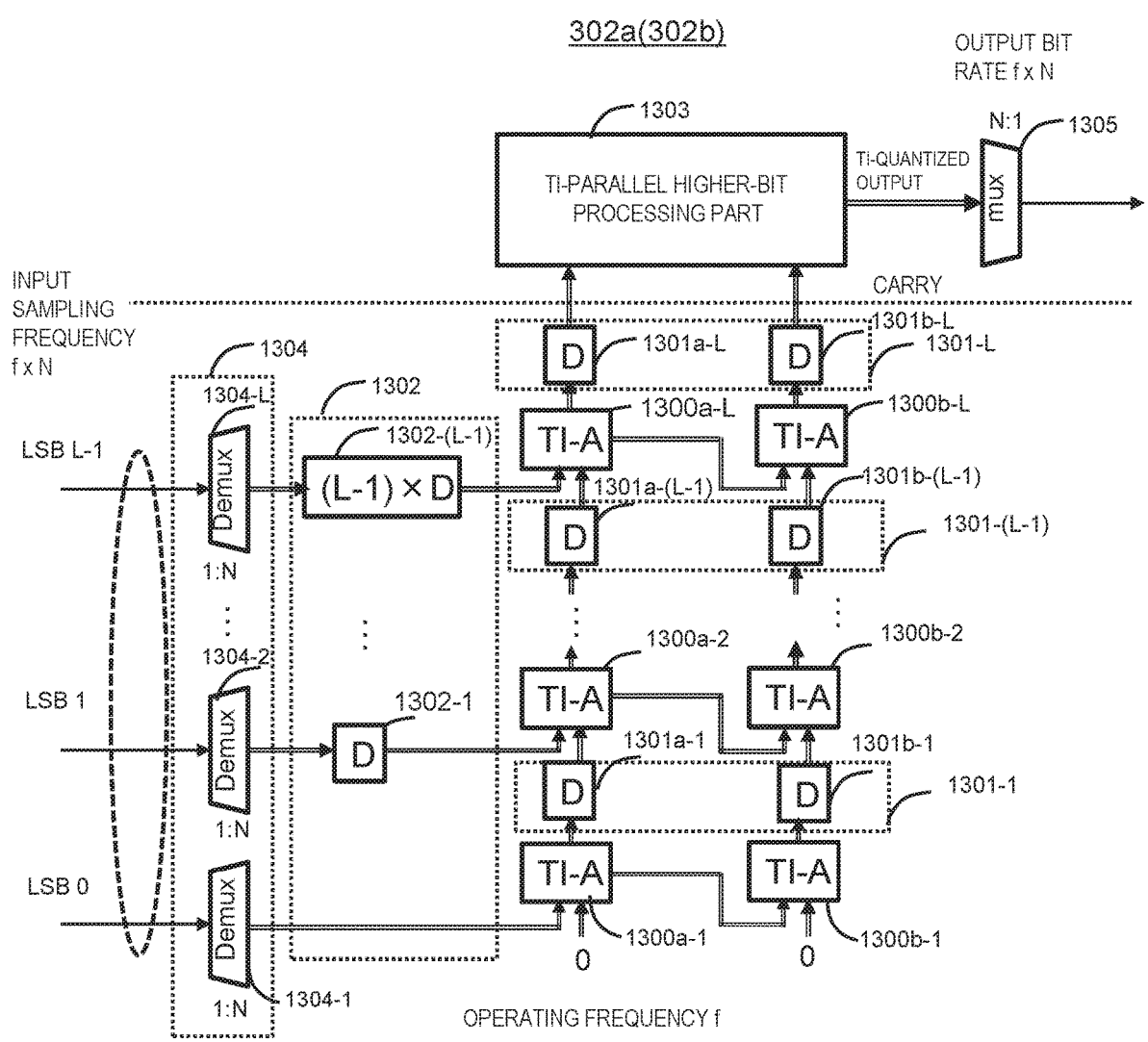
FIG. 13 is a diagram illustrating an arrangement of a third example embodiment.

A third example embodiment, in which time-interleaving is applied, will be described. FIG. 13 is a diagram illustrating an outline of a second-order ΔΣ modulator equipped with time-interleaving. The second-order ΔΣ modulator includes 2L time-interleaved accumulators (TI-A) 1300a-1 to L and 1300b-1 to L, delay parts 1301, an input delay adjustment part 1302, a TI-parallel higher-bit processing part 1303, a demultiplexer part (demux part) 1304, and a multiplexer part (mux part) 1305.

The operation of the second-order ΔΣ modulator of FIG. 13 has a lot in common with the first example embodiment described with reference to FIG. 4A. Therefore, differences from FIG. 4A will be mainly described. The differences from FIG. 4A are, for instance, as follows.

The accumulators 400a-1 to L and the accumulators 400b-1 to L are replaced with TI-accumulators 1300a-1 to L and TI-accumulators 1300b-1 to L.

The parallel higher-bit processing part 403 is replaced with a time-interleaved (TI)-parallel higher-bit processing part 1303.

A demux part 1304 that performs demultiplex (demux) processing on a signal of each digit of an input signal (one to N signals) is provided.

A mux part 1305 that multiplexes the output signal of the TI-parallel higher-bit processing part 1303 (N to one signal) and outputs the multiplexed signals is provided.

Assuming that a sampling frequency of the input and the bit rate of the output is f×N, an operating frequency of the other blocks also need to be f×N in the first and the second example embodiments (in the case of FIG. 4A).

Meanwhile, in the third example embodiment, the operating frequency of the functions (the TI-accumulators 1300a-1 to L and 1300b-1 to L, the delay parts 1301, the input delay adjustment part 1302, and the TI-parallel higher-bit processing part 1303) between the demux part 1304 and the mux part 1305 is f, and the operating frequency is mitigated by increasing the number N of time-interleaving channels. This increases the degree of freedom in design and makes it easy to achieve high-speed operation overall.

Figure 14:
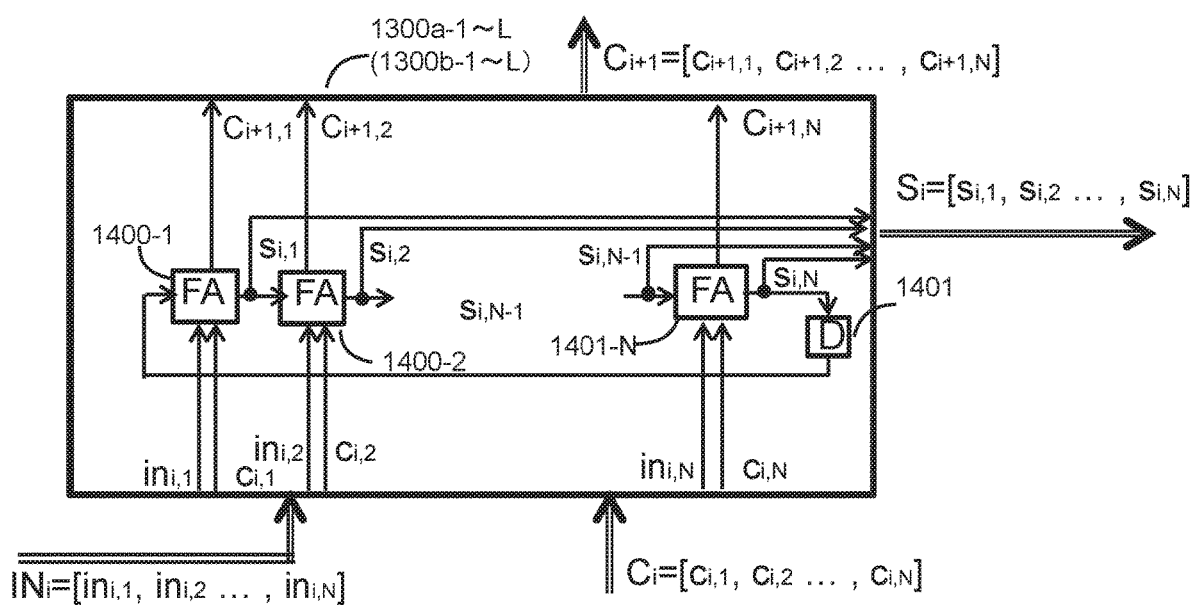
FIG. 14 is a diagram illustrating a TI (time-interleaved)-accumulator of the third example embodiment.

Next, the TI-accumulators 1300a-1 to L and 1300b-1 to L will be described with reference to FIG. 14. Note that the TI-accumulators 1300a-i and 1300b-i (i=1, . . . , L) correspond to an ith level from the bottom.

The TI-accumulators 1300a-1 to L and 1300b-1 to L include N full adders (FA) 1400-1 to N and a delay element (D) 1401.

The inputs are an input signal bundled into N channels by the demux part 1304:

$$IN_i = [in_{i,1}, in_{i,2}, \ldots, in_{i,N}]$$

and an N-channel p carry input:

$$Ci = [c_{i,1}, c_{i,2}, \ldots, c_{i,N}],$$

The outputs are an N-channel sum bit:

$$S_i = [s_{i,1}, s_{i,2}, \ldots, s_{i,N}]$$

and an N-channel carry output:

$$C_{i+1} = [c_{i+1,1}, c_{i+1,2}, \ldots, c_{i+1,N}].$$

The full adders 1400-1 to N are cascade-connected with respect to the addition results. Specifically, a sum bit $S_{i,k}$ outputted from a full adder 1400-$k$ (k=1, . . . , N-1) is used as an input to a full adder 1400-$k$+1. A sum bit $S_{i,N}$ outputted from the final stage full adder 1400-N is delayed by one clock by the delay 1401, and then used as an input to the first stage full adder 1400-1 in the next clock.

Further, regarding inputs to a k-th stage full adder 1400-$k$ (k=1, . . . , N), in addition to the above, $in_{i,k}$ and $c_{i,k}$, each of which is a value obtained from the input signal, are used as input bits, and from the 3-bit input, a sum bit $s_{i,k}$ and carry bit $c_{i+1,k}$ are outputted.

The TI-accumulator 1300a-$i$ (i=1, . . . , L) outputs a bundle of all sum bits $s_{i,k}$ as an N-channel output sum bit $S_i$.

Further, the TI-accumulator 1300a-$i$ (i=1, . . . , L) outputs a bundle of carry bits $c_{i+1,k}$ as an N-channel output carry bit $C_{i+1}$.

Figure 15:
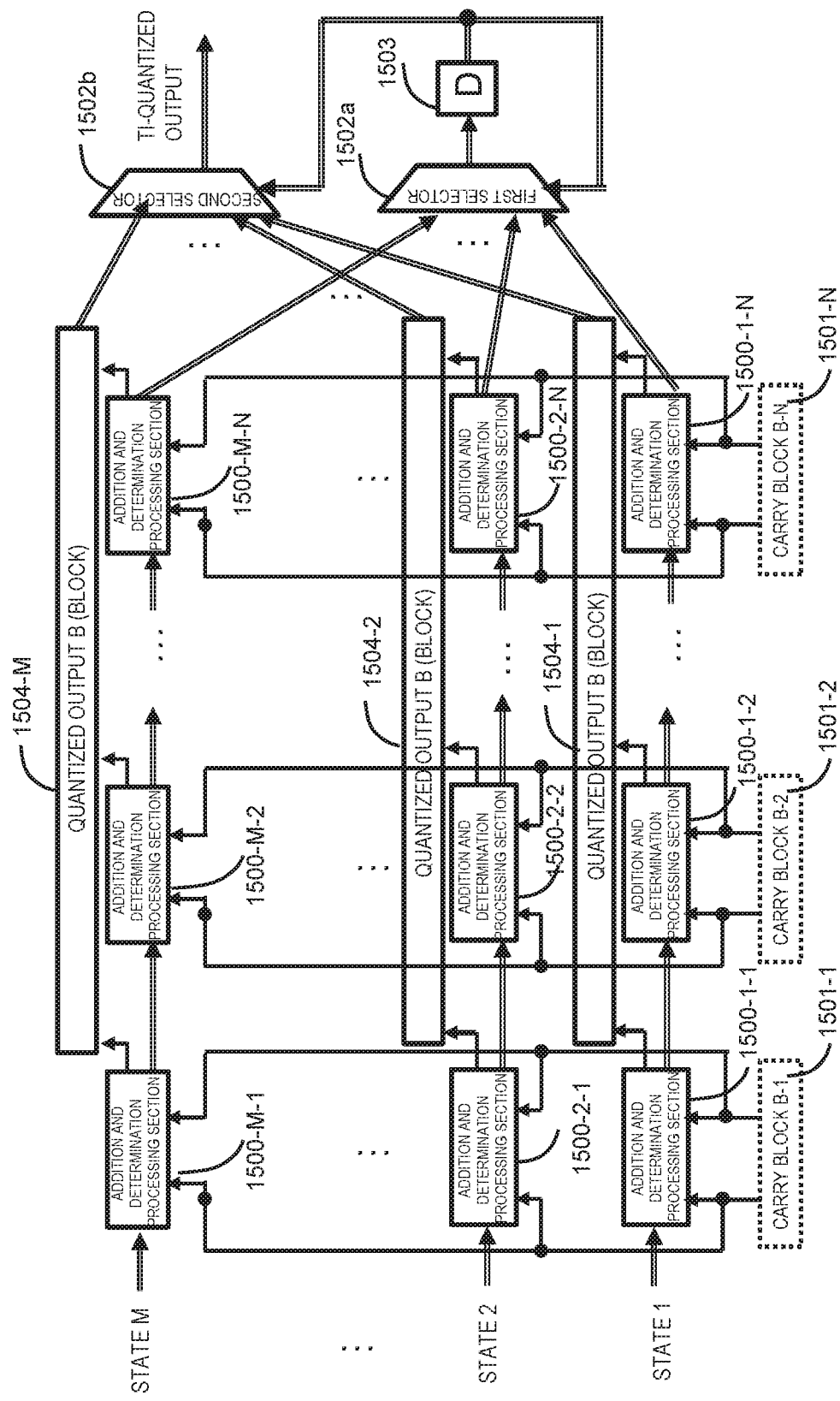
FIG. 15 is a diagram illustrating a TI (time-interleaved)-parallel higher-bit processing part of the third example embodiment.

FIG. 15 is a diagram illustrating a configuration of the TI-parallel higher-bit processing part 1303 in FIG. 13. With reference to FIG. 15, the TI-parallel higher-bit processing part 1303 includes M×N addition and determination processing sections 1500-$i$-$j$ (i=1, . . . , M; j=1, . . . , N), N carry blocks (B) 1501-1 to N, M quantized output blocks (B) 1504-1 to M, a first selector 1502a, a second selector 1502b, and a delay element 1503.

Since the same addition and determination processing sections (refer to FIGS. 7B, 10B, and 12B) used in the first and the second example embodiments are utilized as the addition and determination processing sections 1500-$i$-$j$ (i=1, . . . , M; j=1, . . . , N), the internal description thereof will be omitted. Further, since how M sets of state inputs are determined is also the same as in the first and the second example embodiments, the description will be also omitted. An operation of FIG. 15 will be described below.

The addition and determination processing sections 1500-$i$-$j$ (i=1, . . . , M; j=1, . . . , N) include N columns (stages) of addition and determination processing sections for each of the supplied M states. M addition and determination processing sections in the first column are 1500-1-1 to 1500-M-1, M addition and determination processing sections in the second column are 1500-1-2 to 1500-M-2 and so on, and M addition and determination processing sections in the N-th column are 1500-1-N to 1500-M-N.

The M addition and determination processing sections 1500-1-1 to 1500-M-1 in the first column commonly receive first and second carry inputs outputted from the carry block 1501-1, and receive predetermined M different sets of first and second state inputs. The addition and determination processing sections 1500-1-1 to 1500-M-1 output quantized outputs, first state outputs, and second state outputs as a result of internal calculation. At this time, each of the quantized outputs are fed to each of M quantized output blocks 1504-1 to M allocated corresponding to predetermined M sets of state inputs. Further, the first and the second state outputs are supplied to each of the addition and determination processing sections 1500-1-2 to 1500-M-2 in the second column.

M addition and determination processing sections 1500-1-$k$ to 1500-M-$k$ in a k-th column (k is an integer from 2 to N−1) commonly receive first and second carry inputs outputted from a carry block 1501-$k$, and receive first and second state outputs from a (k−1)-th column (corresponding to first and second state inputs of the k-th column, respectively). The addition and determination processing sections 1500-1-$k$ to 1500-M-$k$ output quantized outputs, first state outputs, and second state outputs as a result of internal calculation. At this time, each of the quantized outputs are fed to each of the M quantized output blocks 1504-1 to M allocated corresponding to the predetermined M sets of state inputs. Further, the first and the second state outputs are supplied to each of M addition and determination processing sections 1500-1-(k+1) to 1500-M-(k+1) in a (k+1)-th column.

The addition and determination processing sections 1500-1-N to 1500-M-N in the N-th column commonly receive first and second carry inputs outputted from the carry B-N, and receive first and second state outputs from the addition and determination processing sections 1500-1-(N−1) to 1500-M-(N−1) in the (N−1)-th column (corresponding to first and second state inputs of the N-th column, respectively).

At this time, each of quantized outputs are fed to each of the M quantized output blocks 1504-1 to M allocated corresponding to the predetermined M sets of state inputs. Further, first and second state outputs from the addition and determination processing sections 1500-1-N to 1500-M-N in the N-th column are supplied to the first selector 1502a.

Further, in this configuration, a delay such as a D flip-flop can be provided in each stage of the addition and determination processing sections. By providing a D flip-flop in each stage of the addition and determination processing sections, it is possible to divide a calculation time for a plurality of addition and determination processing sections into one clock per an addition and determination processing section.

The carry blocks 1501-1 to N and the quantized output blocks 1504-1 to M are affected by the provision of this delay, the details of which will be described later.

Figure 17:
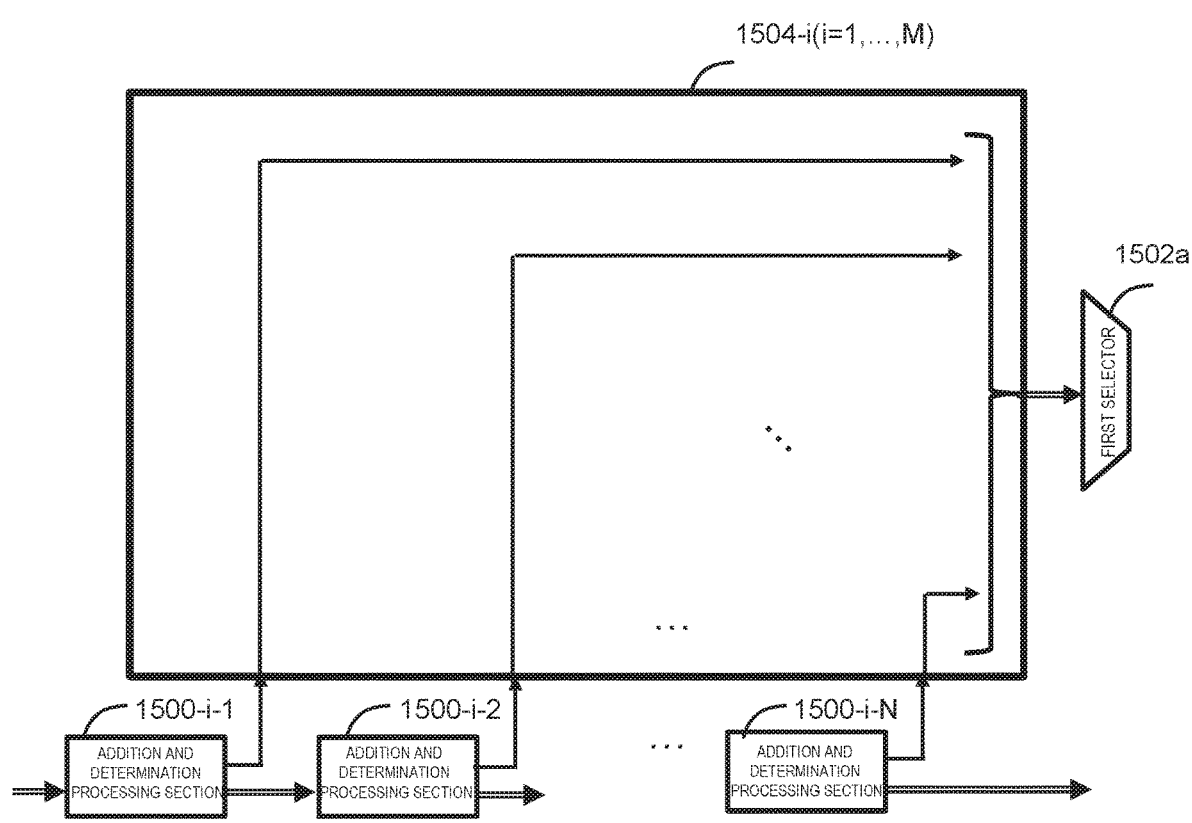
FIG. 17 is a diagram illustrating a quantized output block of a variation of the third example embodiment.

The quantized output blocks 1504-$i$ ($i=1, \ldots, M$) are allocated according to the initial M sets of state inputs, receive the quantized outputs of the N addition and determination processing sections 1500-$i$-1, ..., 1500-$i$-N, and output signals bundled into N channels to the second selector 1502b, for instance as illustrated in FIG. 17.

The selector 1502a selects one state output from M sets of the first and the second state outputs based on a control signal. The second selector 1502b similarly selects and outputs one set of N-channel TI-quantized output signals from the N-channel signals outputted from the M set of the quantized output blocks based on the control signal.

As the control signal for the first selector 1502a and the second selector 1502b, a signal outputted from the delay element 1503 which delays the output signal of the first selector 1502a by one clock is used.

Figure 16:
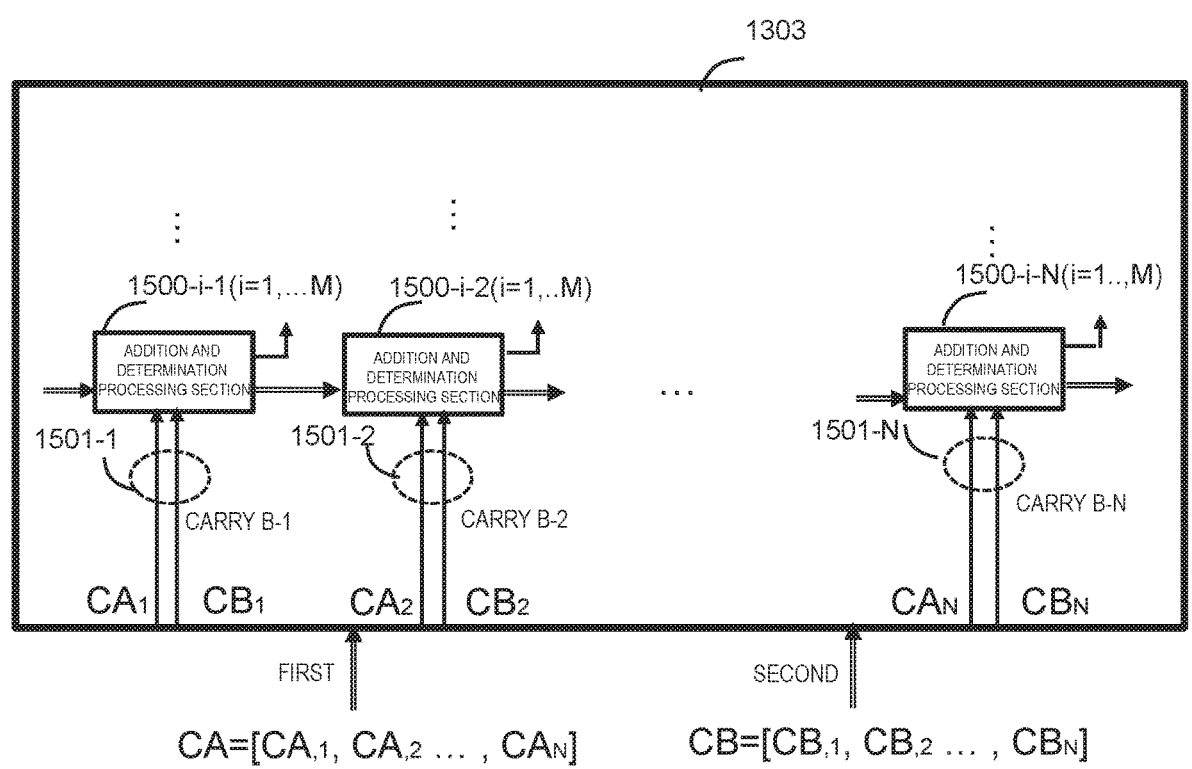
FIG. 16 is a diagram illustrating the TI (time-interleaved)-parallel higher-bit processing part of a variation of a third example embodiment.

FIG. 16 is a diagram illustrating the carry blocks (B) 1501-1 to N illustrated in FIG. 15. With reference to FIG. 16, how the carry blocks (B) 1501-1 to N process a first carry input signal and a second carry input signal will be described.

Out of N-channel first carry inputs, which are input signals to the TI-parallel higher-bit processing part 1303, $$CA=[CA_1, CA_2, \ldots, CA_N]$$

and N-channel second carry inputs:

$$CB=[CB_1, CB_2, \ldots, CB_N],$$

k(k=1, ..., N)-th signals of each, $CA_k$ and $CB_k$ are used as the first carry input and the second carry input of the carry block 1501-$k$.

Further, the delay element 1503 of FIG. 15 is realized by a delay such as a D flip-flop, and the first selector 1502a, the second selector 1502b, and the delay element 1503 operate with a clock having the same frequency as a desired bit rate of the TI-quantized output (f in FIG. 13). There is no particular restriction on the addition and determination processing sections 1500-$i$-$j$ ($i=1, \ldots, M; j=1, \ldots, N$), and the calculation time thereof does not have to be within the same cycle as the bit rate of the TI-quantized output.

Variation

Any of the addition and determination processing sections 1500-$i$-$j$ ($i=1, \ldots, M; j=1, \ldots, N$) may have a D flip-flop, or may use a clock obtained by dividing a clock frequency of a desired bit rate of the quantized output. An example will be described below.

Figure 18:
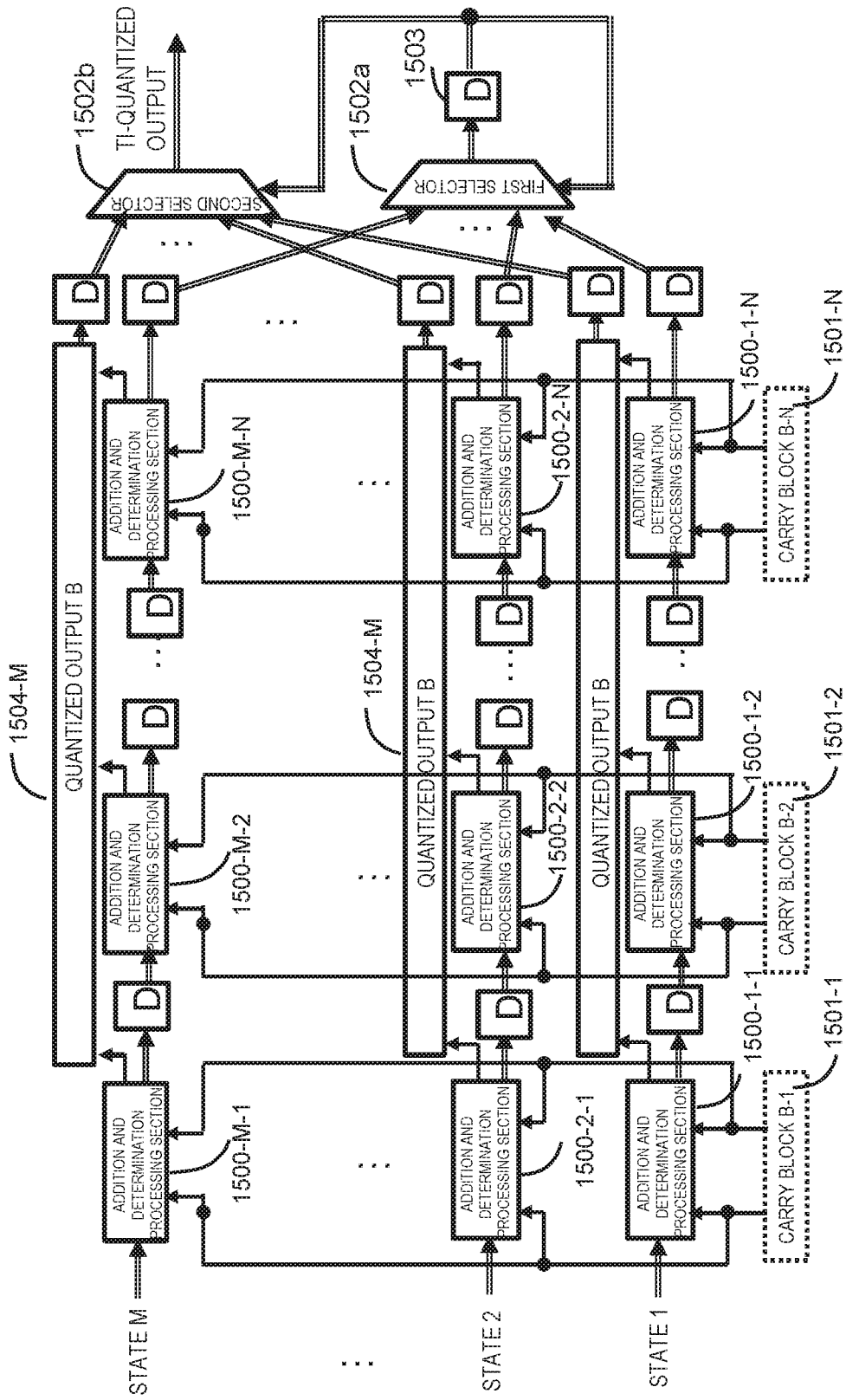
FIG. 18 is a diagram illustrating a TI (time-interleaved)-parallel higher-bit processing part of a variation of the third example embodiment.

FIG. 18 is a diagram illustrating a variation of the third example embodiment. FIG. 18 illustrates an arrangement example in which a D flip-flop provided for each output of the addition and determination processing sections configured for each set (M sets) of state inputs in the structure of the TI-parallel higher-bit processing part 1303 illustrated in FIG. 15, all the circuits in FIG. 18 are operated with a clock having the same frequency as the bit rate f of the TI-quantized output. The carry blocks 1501-1 to N and the quantized output blocks 1504-1 to M are configured, for instance, as illustrated in FIGS. 19 and 20.

Figure 19:
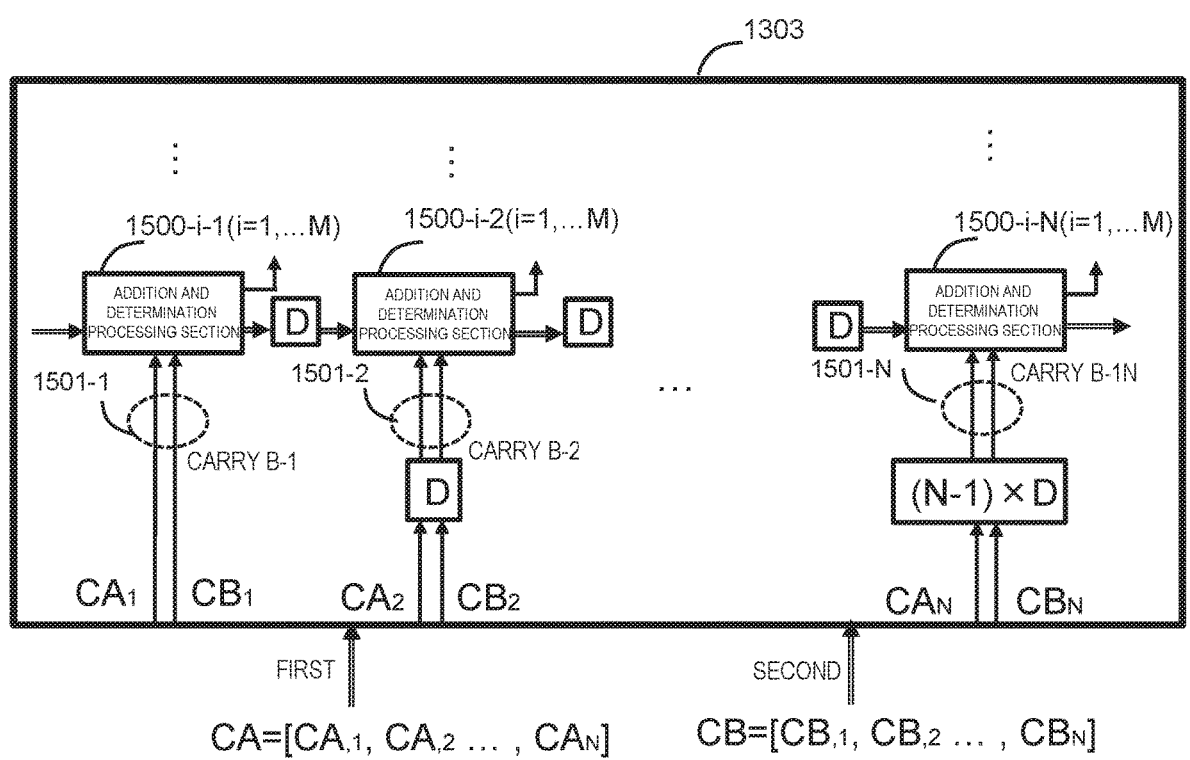
FIG. 19 is a diagram illustrating a TI (time-interleaved)-parallel higher-bit processing part of a variation of the third example embodiment.

As illustrated in FIG. 19, in the carry blocks 1501-1 to N, carry B-k (k=2, ..., N) signals are delayed by (k−1) D flip-flops, and fed to the corresponding addition and determination processing sections 1500-$i$-$j$ ($i=1, \ldots, M; j=2, \ldots, N$).

Figure 20:
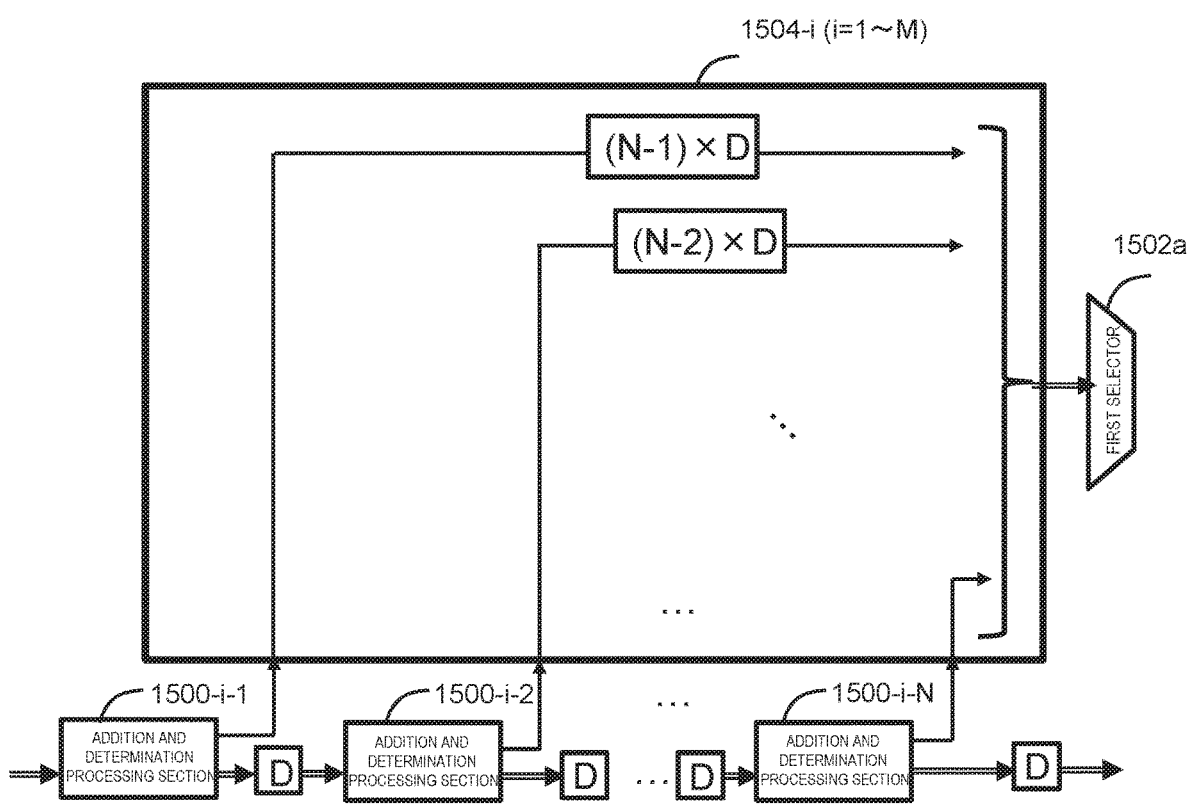
FIG. 20 is a diagram illustrating a quantized output block of the variation of the third example embodiment.

As illustrated in FIG. 20, the quantized output blocks 1504-1 to M delay the quantized output signals of k-th stages (k is an integer of 1, ..., N−1) with (N-k) D flip-flops and bundle the signals (output them in parallel).

With these operations, a calculation time required for the addition and determination processing sections is greatly relaxed and as a result, high-speed operation is achieved overall.

Further, each disclosure of Non-Patent Literatures 1 and 2 cited above is incorporated herein in its entirety by reference thereto. It is to be noted that it is possible to modify or adjust the example embodiments or examples within the whole disclosure of the present invention (including the Claims) and based on the basic technical concept thereof. Further, it is possible to variously combine or select a wide variety of the disclosed elements (including the individual elements of the individual claims, the individual elements of the individual examples and the individual elements of the individual figures) within the scope of the Claims of the present invention. That is, it is self-explanatory that the present invention includes any types of variations and modifications to be done by a skilled person according to the whole disclosure including the Claims, and the technical concept of the present invention.

The example embodiments above can be described as, for instance, (but not limited to) the following supplementary notes.

(Supplementary Note 1)

A second-order delta-sigma modulator comprising at least:

a first accumulator that receives an input bit signal;

a second accumulator that receives a sum bit output of the first accumulator;

a parallel higher-bit processing part that receives, as first and second carry inputs, first and second carry outputs outputted from the first and the second accumulators, and outputs a quantized output;

the parallel higher-bit processing part comprising:

first to M-th (M is an integer not less than 2) addition and determination processing sections each of which receives the first and the second carry inputs and first and second state inputs, and outputs a quantized output and first and second state outputs;

a first selector that receives M sets of the first and the second state outputs outputted from the first to the M-th addition and determination processing sections, selects one set based on a control signal, and outputs the selected set; and a second selector that receives M quantized outputs outputted from the first to the M-th addition and determination processing sections, selects one quantized output based on the control signal, and outputs the selected quantized output; and the parallel higher-bit processing part using the output of the first selector as the control signal in the first and the second selectors.

(Supplementary Note 2)

The second-order delta-sigma modulator according to Supplementary Note 1, wherein the addition and determination processing section includes:

a first adder that receives at least the first state input and the first carry input and outputs the first state output which is a calculation result of signals received;

a second adder that receives at least the second state input and the second carry input and outputs the second state output which is a calculation result of signals received; and a sign determination unit that receives the second state input or the second state output and outputs a determination result of a sign of a value of a signal received, an output of the sign determination unit being the quantized output of the addition and determination processing section.

(Supplementary Note 3)

The second-order delta-sigma modulator according to Supplementary Note 2, wherein the first adder receives the output of the sign determination unit in addition to the first state input and the first carry input, and outputs the first state output based on the received first state input, first carry input, and output of the sign determination unit, the second adder receives the first state output from the first adder and the output of the sign determination unit in addition to the second state input and the second carry input, and outputs the second state output based on the second state input, the second carry input, the first state output, and the output of the sign determination unit, and the sign determination unit receives the second state input to output a determination result of the sign of the value of the second state input.

(Supplementary Note 4)

The second-order delta-sigma modulator according to Supplementary Note 2, wherein the addition and determination processing section further includes a second sign determination unit that receives the second state input, determines the sign of the value of the second state input, and outputs the result, the first adder further receives the output of the second sign determination unit in addition to the first state input and the first carry input, and outputs the first state output based on the first state input, the first carry input, and the output of the second sign determination unit, the second adder further receives the output from the first adder and the output of the second sign determination unit in addition to the second state input and the second carry input, and outputs the second state output based on the second state input, the second carry input, the output of the first adder, and the output of the second sign determination unit, and the sign determination unit receives the second state output and outputs a determination result of the sign of the value of the second state input.

(Supplementary Note 5)

The second-order delta-sigma modulator according to Supplementary Note 2, wherein the first adder further receives the output of the sign determination unit in addition to the first state input and the first carry input, and outputs the first state output based on the first state input, the first carry input, and the output of the sign determination unit, the second adder further receives the first state input and a signal obtained by doubling the output of the sign determination unit in addition to the second state input and the second carry input, and outputs the second state output based on the first state input, the second state input, the second carry input, and the signal obtained by doubling the output of the sign determination unit, and the sign determination unit receives the second state input to output a determination result of the sign of the value of the second state input.

(Supplementary Note 6)

The second-order delta-sigma modulator according to any one of Supplementary Notes 1 to 5, wherein each of the first and the second accumulators includes:

a full adder that includes first and second input terminals for respectively receiving two bit signals to be added, a carry input terminal for receiving a carry input, a carry output terminal for outputting a carry output of an addition result of the two bit signals, and an output terminal for outputting a sum bit of the addition result; and a delay element that delays the sum bit outputted from the full adder and feeds back the sum bit delayed to the second input terminal of the full adder, wherein the second-order delta-sigma modulator includes:

a first accumulator group that includes, in correspondence with a plurality of bits inputs, a plurality of stages of the first accumulators, each stage thereof supplying each carry output thereof to a next stage as a carry input; and a second accumulator group that includes a plurality of stages of the second accumulators, each stage thereof receiving each sum bit outputted from the corresponding stage of the first accumulator group, and supplying each carry output thereof to a next stage as a carry input, wherein the carry input terminals of the full adders of the first and the second accumulators in first stages are set to zero, and the carry outputs from the carry output terminals of the full adders of the first and the second accumulators in final stages are supplied to the parallel higher-bit processing part, as the first and the second carry inputs.

(Supplementary Note 7)

The second-order delta-sigma modulator according to any one of Supplementary Notes 1 to 5 comprising a demultiplexer provided for each bit that serially receives an input bit and converts the input bit received into parallel N bits (N is an integer not less than 2), the parallel N bits being supplied to each of the first accumulators, wherein the parallel higher-bit processing part includes first to N-th groups of the addition and determination processing sections, each group of which includes the first to the M-th addition and determination processing sections, and receives, as the first and the second carry inputs, each one bit of N sets of first and second carry outputs from the first and the second accumulators, respectively, wherein the first to the M-th addition and determination processing sections in the addition and determination processing sections of the i-th group (i is 1 to N−1) supply the first and the second state outputs to the first to the M-th addition and determination processing sections in the addition and determination processing sections of the (i+1)-th group, as the first and the second state inputs, wherein the first selector that receives M sets of the first and the second state outputs outputted from the first to the M-th addition and determination processing sections of the N-th group and selects one set from the M sets of the first and the second state outputs based on the control signal, wherein the second selector receives M number of N-bit quantized outputs from the first to the M-th addition and determination processing sections of the first to the N-th groups, selects a single N-bit quantized output from the M number of the N-bit quantized outputs, based on the control signal, and outputs the single N-bit quantized output selected, and wherein the second-order delta-sigma modulator further comprises a multiplexer that converts the single N-bit quantized output outputted from the parallel higher-bit processing part into a 1-bit serial output.

(Supplementary Note 8)

The second-order delta-sigma modulator according to Supplementary Note 7, wherein each of the first and the second accumulators includes first to N-th full adders, each of which sends a sum bit, which is a calculation result, to a succeeding stage, wherein a sum bit output of the N-th full adder is delayed by a delay element and fed back to an input of the first full adder, N bit carry outputs of the first to the N-th full adders are supplied to carry input terminals of corresponding full adders of a next stage accumulator, carry inputs of the full adders of the first stage accumulators being set to zero, and N bits of sum bit outputs of the first to the N-th full adders of the first accumulator are supplied to inputs of the second accumulator.

(Supplementary Note 9)

The second-order delta-sigma modulator according to Supplementary Note 7 or 8, comprising:

a delay element arranged at a succeeding stage of an output of each of the first to the M-th addition and determination processing sections in each of the first to the N-th groups of the addition and determination processing sections;

a delay element provided for each of (N−1) sets out of N sets of the first and the second carries received by the first to the N-th groups of the addition and determination processing sections, the delay element having a different delay time for each set; and a delay element provided for each of (N−1) sets out of N sets of quantized outputs in the first to the M-th addition and determination processing sections in the first to the N-th groups of the addition and determination processing sections, the delay element having a different delay time for each set.

(Supplementary Note 10)

A transmission apparatus comprising the second-order delta-sigma modulator according to any one of Supplementary Note 1 to 9.

(Supplementary Note 11)

A transmission apparatus including:

a baseband signal generator that generates a baseband signal;

first and second second-order delta-sigma modulators that respectively receive an in-phase baseband signal and a quadrature baseband signal outputted from the baseband signal generator;

a quadrature modulation part that performs quadrature-modulation of outputs of the first and the second second-order delta-sigma modulators; and an amplifier that amplifies a power of an output signal of the quadrature modulation part and supplies an amplified signal to an antenna, wherein each of the first and the second second-order delta-sigma modulators includes at least:

a first accumulator that receives an input bit signal;

a second accumulator that receives a sum bit output of the first accumulator;

a parallel higher-bit processing part that receives, as first and second carry inputs, first and second carry outputs outputted from the first and the second accumulators, and outputs a quantized output, wherein the parallel higher-bit processing part comprises:

first to M-th (M is an integer not less than 2) addition and determination processing sections, each of which receives the first and the second carry inputs and first and second state inputs, and outputs a quantized output and first and second state outputs;

a first selector that receives M sets of the first and the second state outputs outputted from the first to the M-th addition and determination processing sections, selects a set from the M sets of the first and the second state outputs based on a control signal, and outputs the set selected; and a second selector that receives M quantized outputs outputted from the first to the M-th addition and determination processing sections, selects one quantized output from the M quantized outputs based on the control signal and outputs the quantized output selected, the output of the first selector being used as the control signal in the first and the second selectors.

(Supplementary Note 12)

The transmission apparatus according to Supplementary Note 11, wherein the addition and determination processing section includes:

a first adder that receives at least the first state input and the first carry input and outputs the first state output which is a calculation result of signals received;

a second adder that receives at least the second state input and the second carry input and outputs the second state output which is a calculation result of signals received; and a sign determination unit that receives the second state input or the second state output and outputs a determination result of a sign of a value of a signal received, an output of the sign determination unit being the quantized output of the addition and determination processing section.

(Supplementary Note 13)

The transmission apparatus according to Supplementary Note 12, wherein the first adder receives the output of the sign determination unit in addition to the first state input and the first carry input, and outputs the first state output based on the received first state input, first carry input, and output of the sign determination unit, the second adder receives the first state output from the first adder and the output of the sign determination unit in addition to the second state input and the second carry input, and outputs the second state output based on the second state input, the second carry input, the first state output, and the output of the sign determination unit, and the sign determination unit receives the second state input to output a determination result of the sign of the value of the second state input.

(Supplementary Note 14)

The transmission apparatus according to Supplementary Note 12, wherein the addition and determination processing section further includes a second sign determination unit that receives the second state input, determines the sign of the value of the second state input, and outputs the result, the first adder further receives the output of the second sign determination unit in addition to the first state input and the first carry input, and outputs the first state output based on the first state input, the first carry input, and the output of the second sign determination unit, the second adder further receives the output from the first adder and the output of the second sign determination unit in addition to the second state input and the second carry input, and outputs the second state output based on the second state input, the second carry input, the output of the first adder, and the output of the second sign determination unit, and the sign determination unit receives the second state output and outputs a determination result of the sign of the value of the second state input.

(Supplementary Note 15)

The transmission apparatus according to Supplementary Note 12, wherein the first adder further receives the output of the sign determination unit in addition to the first state input and the first carry input, and outputs the first state output based on the first state input, the first carry input, and the output of the sign determination unit, the second adder further receives the first state input and a signal obtained by doubling the output of the sign determination unit in addition to the second state input and the second carry input, and outputs the second state output based on the first state input, the second state input, the second carry input, and the signal obtained by doubling the output of the sign determination unit, and the sign determination unit receives the second state input to output a determination result of the sign of the value of the second state input.

(Supplementary Note 16)

The transmission apparatus according to any one of Supplementary Notes 11 to 15, wherein each of the first and the second accumulators includes:

a full adder that includes first and second input terminals for respectively receiving two bit signals to be added, a carry input terminal for receiving a carry input, a carry output terminal for outputting a carry output of an addition result of the two bit signals, and an output terminal for outputting a sum bit of the addition result; and a delay element that delays the sum bit outputted from the full adder and feeds back the sum bit delayed to the second input terminal of the full adder, wherein the second-order delta-sigma modulator includes:

a first accumulator group that includes, in correspondence with a plurality of bits inputs, a plurality of stages of the first accumulators, each stage thereof supplying each carry output thereof to a next stage as a carry input; and a second accumulator group that includes a plurality of stages of the second accumulators, each stage thereof receiving each sum bit outputted from the corresponding stage of the first accumulator group, and supplying each carry output thereof to a next stage as a carry input, wherein the carry input terminals of the full adders of the first and the second accumulators in first stages are set to zero, and the carry outputs from the carry output terminals of the full adders of the first and the second accumulators in final stages are supplied to the parallel higher-bit processing part, as the first and the second carry inputs.

(Supplementary Note 17)

The transmission apparatus according to any one of Supplementary Notes 11 to 15 comprising a demultiplexer provided for each bit that serially receives an input bit and converts the input bit received into parallel N bits (N is an integer not less than 2), wherein the parallel N bits are supplied to each of the first accumulators, the parallel higher-bit processing part includes first to N-th groups of the addition and determination processing sections each group of which includes the first to the M-th addition and determination processing sections, receives each one bit of N sets of first and second carry outputs from the first and the second accumulators as the first and the second carry inputs, respectively, the first to the M-th addition and determination processing sections in the addition and determination processing sections of the ith group (i is 1 to N−1) supply the first and the second state outputs to the first to the M-th addition and determination processing sections in the addition and determination processing sections of the (i+1)th group as the first and the second state inputs, the first selector receives M sets of the first and the second state outputs outputted from the first to the M-th addition and determination processing sections of the N-th group and selects one set based on the control signal, the second selector receives M number of N-bit quantized outputs from the first to the M-th addition and determination processing sections of the first to the N-th groups, and selects one N-bit quantized output based on the control signal, and a multiplexer that converts the N-bit quantized output from the parallel higher-bit processing part into a 1-bit serial output and outputs the result is provided.

(Supplementary Note 18)

The transmission apparatus according to Supplementary Note 17, wherein each of the first and the second accumulators includes first to N-th full adders that send sum bits, which are calculation results, to next stages, the sum bit output of the N-th full adder is fed back to an input of the first full adder, an N-bit carry output of the first to the N-th full adders is supplied to a carry input terminal of a corresponding full adder of a next stage accumulator, carry inputs of the full adders of the first stage accumulators are set to zero, and an N-bit sum bit output of the first to the N-th full adders of the first accumulator is supplied to an input of the second accumulator.

(Supplementary Note 19)

A second-order delta-sigma modulation method comprising:

a parallel higher-bit processing step of receiving first and second carry outputs from the first accumulator that receives an input bit signal and the second accumulator that receives a sum bit output of the first accumulator as first and second carry inputs, and of outputting a quantized output, wherein the parallel higher-bit processing step includes:

first to M-th (M is an integer not less than 2) addition/determination processing steps of receiving the first and the second carry inputs and first and second state inputs, and outputting a quantized output and first and second state outputs;

a first selection step of receiving M sets of the first and the second state outputs outputted in the first to the M-th addition/determination processing steps, selecting one set based on a control signal, and outputting the selected set;

a second selection step of receiving M quantized outputs outputted in the first to the M-th addition/determination processing steps, selecting one quantized output according to the delayed control signal, and outputting the selected quantized output; and a step of delaying the first and the second state outputs selected by the first selector and using the delayed signals as the control signal for the first and the second selectors.

(Supplementary Note 20)

The second-order delta-sigma modulation method according to Supplementary Note 19, wherein the addition/determination processing step includes:

a first addition step of receiving at least the first state input and the first carry input, and outputting the first state output, which is a calculation result;

a second addition step of receiving at least the second state input and the second carry input, and outputting the second state output, which is a calculation result; and a sign determination step of receiving the second state input or the second state output, and outputting a determination result of the sign of the value of a received signal, and the output of the sign determination step is used as a quantized output of the addition/determination processing step.

(Supplementary Note 21)

The second-order delta-sigma modulation method according to Supplementary Note 20, wherein in the first addition step, the output of the sign determination step is received in addition to the first state input and the first carry input, and the first state output is outputted based on the received first state input, first carry input, and output of the sign determination step, in the second addition step, the first state output from the first adder and the output of the sign determination step are received in addition to the second state input and the second carry input, and the second state output is outputted based on the second state input, the second carry input, the first state output, and the output of the sign determination step, and in the sign determination step, the second state input is received and a determination result of the sign of the value of the second state input is outputted.

(Supplementary Note 22)

The second-order delta-sigma modulation method according to Supplementary Note 20, wherein the addition/determination processing step further includes a second sign determination step of receiving the second state input, determining the sign of the value of the second state input, and outputting the result, in the first addition step, the output of the second sign determination step is further received in addition to the first state input and the first carry input, and the first state output is outputted based on the first state input, the first carry input, and the output of the second sign determination step, in the second addition step, the output from the first addition step and the output of the second sign determination step are further received in addition to the second state input and the second carry input, and the second state output is outputted based on the second state input, the second carry input, the output of the first addition step, and the output of the second sign determination step, and in the sign determination step, the second state output is received and a determination result of the sign of the value of the second state input is outputted.

(Supplementary Note 23)

The second-order delta-sigma modulation method according to Supplementary Note 20, wherein in the first addition step, the output of the sign determination step is further received in addition to the first state input and the first carry input, and the first state output is outputted based on the first state input, the first carry input, and the output of the sign determination step, in the second addition step, the first state input and a signal obtained by doubling the output of the sign determination step are further received in addition to the second state input and the second carry input, and the second state output is outputted based on the first state input, the second state input, the second carry input, and the signal obtained by doubling the output of the sign determination step, and in the sign determination step, the second state input is received and a determination result of the sign of the value of the second state input is outputted.

What is claimed is:

1. A second-order delta-sigma modulator comprising at least:

a first accumulator that receives an input bit signal;

a second accumulator that receives a sum bit output of the first accumulator;

a parallel higher-bit processing part that receives, as first and second carry inputs, first and second carry outputs outputted from the first and the second accumulators, and outputs a quantized output, wherein the parallel higher-bit processing part comprises:

first to M-th (M is an integer not less than 2) addition and determination processing sections, each of which receives the first and the second carry inputs and first and second state inputs, and outputs a quantized output and first and second state outputs;

a first selector that receives M sets of the first and the second state outputs outputted from the first to the M-th addition and determination processing sections, selects a set from the M sets of the first and the second state outputs based on a control signal, and outputs the set selected; and a second selector that receives M quantized outputs outputted from the first to the M-th addition and determination processing sections, selects one quantized output from the M quantized outputs based on the control signal and outputs the quantized output selected, the output of the first selector being used as the control signal in the first and the second selectors.

2. The second-order delta-sigma modulator according to claim 1, wherein the addition and determination processing section includes:

a first adder that receives at least the first state input and the first carry input and outputs the first state output which is a calculation result of signals received;

a second adder that receives at least the second state input and the second carry input and outputs the second state output which is a calculation result of signals received; and a sign determination unit that receives the second state input or the second state output and outputs a determination result of a sign of a value of a signal received, an output of the sign determination unit being the quantized output of the addition and determination processing section.

3. The second-order delta-sigma modulator according to claim 2, wherein the first adder receives the output of the sign determination unit in addition to the first state input and the first carry input and outputs the first state output, based on the received first state input, first carry input, and the output of the sign determination unit, wherein the second adder receives the first state output from the first adder and the output of the sign determination unit in addition to the second state input and the second carry input and outputs the second state output, based on the second state input, the second carry input, the first state output, and the output of the sign determination unit, and wherein the sign determination unit receives the second state input and outputs a determination result of a sign of a value of the second state input.

4. The second-order delta-sigma modulator according to claim 2, wherein the addition and determination processing section further includes a second sign determination unit that receives the second state input, and determines a sign of a value of the second state input to output a determination result, wherein the first adder further receives an output of the second sign determination unit in addition to the first state input and the first carry input, and outputs the first state output, based on the first state input, the first carry input, and the output of the second sign determination unit, wherein the second adder further receives the output from the first adder and the output of the second sign determination unit in addition to the second state input and the second carry input, and outputs the second state output, based on the second state input, the second carry input, the output of the first adder, and the output of the second sign determination unit, and wherein the sign determination unit receives the second state output and outputs a determination result of the sign of the value of the second state input.

5. The second-order delta-sigma modulator according to claim 2, wherein the first adder further receives the output of the sign determination unit in addition to the first state input and the first carry input, and outputs the first state output, based on the first state input, the first carry input, and the output of the sign determination unit, wherein the second adder further receives the first state input and a signal obtained by doubling the output of the sign determination unit, in addition to the second state input and the second carry input, and outputs the second state output, based on the first state input, the second state input, the second carry input, and the signal obtained by doubling the output of the sign determination unit, and wherein the sign determination unit receives the second state input and output a determination result of a sign of a value of the second state input.

6. The second-order delta-sigma modulator according to claim 1, wherein each of the first and the second accumulators includes:

a full adder that includes first and second input terminals for respectively receiving two bit signals to be added, a carry input terminal for receiving a carry input, a carry output terminal for outputting a carry output of an addition result of the two bit signals, and an output terminal for outputting a sum bit of the addition result; and a delay element that delays the sum bit outputted from the full adder and feeds back the sum bit delayed to the second input terminal of the full adder, wherein the second-order delta-sigma modulator includes:

a first accumulator group that includes, in correspondence with a plurality of bits inputs, a plurality of stages of the first accumulators, each stage thereof supplying each carry output thereof to a next stage as a carry input; and a second accumulator group that includes a plurality of stages of the second accumulators, each stage thereof receiving each sum bit outputted from the corresponding stage of the first accumulator group, and supplying each carry output thereof to a next stage as a carry input, wherein the carry input terminals of the full adders of the first and the second accumulators in first stages are set to zero, and the carry outputs from the carry output terminals of the full adders of the first and the second accumulators in final stages are supplied to the parallel higher-bit processing part, as the first and the second carry inputs.

7. The second-order delta-sigma modulator according to claim 1, comprising a demultiplexer provided for each bit that serially receives an input bit and converts the input bit received into parallel N bits (N is an integer not less than 2), the parallel N bits being supplied to each of the first accumulators, wherein the parallel higher-bit processing part includes first to N-th groups of the addition and determination processing sections, each group of which includes the first to the M-th addition and determination processing sections, and receives, as the first and the second carry inputs, each one bit of N sets of first and second carry outputs from the first and the second accumulators, respectively, wherein the first to the M-th addition and determination processing sections in the addition and determination processing sections of the i-th group (i is 1 to N−1) supply the first and the second state outputs to the first to the M-th addition and determination processing sections in the addition and determination processing sections of the (i+1)-th group, as the first and the second state inputs, wherein the first selector that receives M sets of the first and the second state outputs outputted from the first to the M-th addition and determination processing sections of the N-th group and selects one set from the M sets of the first and the second state outputs based on the control signal, wherein the second selector receives M number of N-bit quantized outputs from the first to the M-th addition and determination processing sections of the first to the N-th groups, selects a single N-bit quantized output from the M number of the N-bit quantized outputs, based on the control signal, and outputs the single N-bit quantized output selected, and wherein the second-order delta-sigma modulator further comprises a multiplexer that converts the single N-bit quantized output outputted from the parallel higher-bit processing part into a 1-bit serial output.

8. The second-order delta-sigma modulator according to claim 7, wherein each of the first and the second accumulators includes first to N-th full adders, each of which sends a sum bit, which is a calculation result, to a succeeding stage, wherein a sum bit output of the N-th full adder is delayed by a delay element and fed back to an input of the first full adder, N bit carry outputs of the first to the N-th full adders are supplied to carry input terminals of corresponding full adders of a next stage accumulator, carry inputs of the full adders of the first stage accumulators being set to zero, and N bits of sum bit outputs of the first to the N-th full adders of the first accumulator are supplied to inputs of the second accumulator.

9. The second-order delta-sigma modulator according to claim 7, wherein the parallel higher-bit processing part further comprises:
a first delay element arranged at a succeeding stage of an output of each of the first to the M-th addition and determination processing sections in each of the first to the N-th groups of the addition and determination processing sections;
a second delay element provided for each of (N−1) sets out of N sets of the first and the second carries received by the first to the N-th groups of the addition and determination processing sections, the second delay element having a different delay time for each set; and
a third delay element provided for each of (N−1) sets out of N sets of quantized outputs in the first to the M-th addition and determination processing sections in the first to the N-th groups of the addition and determination processing sections, the third delay element having a different delay time for each set.

10. A transmission apparatus comprising
a second-order delta-sigma modulator including:
a first accumulator that receives an input bit signal;
a second accumulator that receives a sum bit output of the first accumulator;
a parallel higher-bit processing part that receives, as first and second carry inputs, first and second carry outputs outputted from the first and the second accumulators, and outputs a quantized output, wherein
the parallel higher-bit processing part comprises:
first to M-th (M is an integer not less than 2) addition and determination processing sections, each of which receives the first and the second carry inputs and first and second state inputs, and outputs a quantized output and first and second state outputs;
a first selector that receives M sets of the first and the second state outputs outputted from the first to the M-th addition and determination processing sections, selects a set from the M sets of the first and the second state outputs based on a control signal, and outputs the set selected; and
a second selector that receives M quantized outputs outputted from the first to the M-th addition and determination processing sections, selects one quantized output from the M quantized outputs based on the control signal and outputs the quantized output selected,
the output of the first selector being used as the control signal in the first and the second selectors.

11. The transmission apparatus according to claim 10, further comprising:
a baseband signal generator that generates a baseband signal;
a pair of the second-order delta-sigma modulators, the pair of the second-order delta-sigma modulators respectively receiving an in-phase baseband signal and a quadrature baseband signal outputted from the baseband signal generator;
a quadrature modulation part that quadrature-modulates outputs of the pair of the second second-order delta-sigma modulators; and
an amplifier that amplifies a power of an output signal of the quadrature modulation part and supplies an amplified signal to an antenna.

12. The transmission apparatus according to claim 10, wherein the addition and determination processing section included in the parallel higher-bit processing part of the second-order delta-sigma modulator, includes:
a first adder that receives at least the first state input and the first carry input and outputs the first state output which is a calculation result of signals received;
a second adder that receives at least the second state input and the second carry input and outputs the second state output which is a calculation result of signals received; and
a sign determination unit that receives the second state input or the second state output and outputs a determination result of a sign of a value of a signal received,
an output of the sign determination unit being the quantized output of the addition and determination processing section.

13. The transmission apparatus according to claim 12, wherein
the first adder receives the output of the sign determination unit in addition to the first state input and the first carry input and outputs the first state output, based on the received first state input, first carry input, and the output of the sign determination unit, wherein
the second adder receives the first state output from the first adder and the output of the sign determination unit in addition to the second state input and the second carry input and outputs the second state output, based on the second state input, the second carry input, the first state output, and the output of the sign determination unit, and wherein
the sign determination unit receives the second state input and outputs a determination result of a sign of a value of the second state input.

14. The transmission apparatus according to claim 12, wherein
the addition and determination processing section further includes
a second sign determination unit that receives the second state input, and determines a sign of a value of the second state input to output a determination result, wherein
the first adder further receives an output of the second sign determination unit in addition to the first state input and the first carry input, and outputs the first state output, based on the first state input, the first carry input, and the output of the second sign determination unit, wherein
the second adder further receives the output from the first adder and the output of the second sign determination unit in addition to the second state input and the second carry input, and outputs the second state output, based on the second state input, the second carry input, the output of the first adder, and the output of the second sign determination unit, and wherein
the sign determination unit receives the second state output and outputs a determination result of the sign of the value of the second state input.

15. The transmission apparatus according to claim 12, wherein
the first adder further receives the output of the sign determination unit in addition to the first state input and the first carry input, and outputs the first state output, based on the first state input, the first carry input, and the output of the sign determination unit, wherein
the second adder further receives the first state input and a signal obtained by doubling the output of the sign determination unit, in addition to the second state input and the second carry input, and outputs the second state output, based on the first state input, the second state input, the second carry input, and the signal obtained by doubling the output of the sign determination unit, and wherein the sign determination unit receives the second state input and output a determination result of a sign of a value of the second state input.

16. The transmission apparatus according to claim 10, wherein each of the first and the second accumulators in the second-order delta-sigma modulator includes:

a full adder that includes first and second input terminals for respectively receiving two bit signals to be added, a carry input terminal for receiving a carry input, a carry output terminal for outputting a carry output of an addition result of the two bit signals, and an output terminal for outputting a sum bit of the addition result; and a delay element that delays the sum bit outputted from the full adder and feeds back the sum bit delayed to the second input terminal of the full adder, wherein the second-order delta-sigma modulator includes:

a first accumulator group that includes, in correspondence with a plurality of bits inputs, a plurality of stages of the first accumulators, each stage thereof supplying each carry output thereof to a next stage as a carry input; and a second accumulator group that includes a plurality of stages of the second accumulators, each stage thereof receiving each sum bit outputted from the corresponding stage of the first accumulator group, and supplying each carry output thereof to a next stage as a carry input, wherein the carry input terminals of the full adders of the first and the second accumulators in first stages are set to zero, and the carry outputs from the carry output terminals of the full adders of the first and the second accumulators in final stages are supplied to the parallel higher-bit processing part, as the first and the second carry inputs.

17. The transmission apparatus according to claim 10, wherein the second-order delta-sigma modulator comprises a demultiplexer provided for each bit that serially receives an input bit and converts the input bit received into parallel N bits (N is an integer not less than 2), the parallel N bits being supplied to each of the first accumulators, wherein the parallel higher-bit processing part in the second-order delta-sigma modulator includes first to N-th groups of the addition and determination processing sections, each group of which includes the first to the M-th addition and determination processing sections, and receives, as the first and the second carry inputs, each one bit of N sets of first and second carry outputs from the first and the second accumulators, respectively, wherein the first to the M-th addition and determination processing sections in the addition and determination processing sections of the i-th group (i is 1 to N−1) supply the first and the second state outputs to the first to the M-th addition and determination processing sections in the addition and determination processing sections of the (i+1)-th group, as the first and the second state inputs, wherein the first selector that receives M sets of the first and the second state outputs outputted from the first to the M-th addition and determination processing sections of the N-th group and selects one set from the M sets of the first and the second state outputs based on the control signal, wherein the second selector receives M number of N-bit quantized outputs from the first to the M-th addition and determination processing sections of the first to the N-th groups, selects a single N-bit quantized output from the M number of the N-bit quantized outputs, based on the control signal, and outputs the single N-bit quantized output selected, and wherein the second-order delta-sigma modulator further comprises a multiplexer that converts the single N-bit quantized output outputted from the parallel higher-bit processing part into a 1-bit serial output.

18. The transmission apparatus according to claim 10, wherein each of the first and the second accumulators in the second-order delta-sigma modulator includes first to N-th full adders, each of which sends a sum bit, which is a calculation result, to a succeeding stage, wherein a sum bit output of the N-th full adder is delayed by a delay element and fed back to an input of the first full adder, N bit carry outputs of the first to the N-th full adders are supplied to carry input terminals of corresponding full adders of a next stage accumulator, carry inputs of the full adders of the first stage accumulators being set to zero, and N bits of sum bit outputs of the first to the N-th full adders of the first accumulator are supplied to inputs of the second accumulator.

19. The transmission apparatus according to claim 17, wherein the parallel higher-bit processing part further comprises:

a first delay element arranged at a succeeding stage of an output of each of the first to the M-th addition and determination processing sections in each of the first to the N-th groups of the addition and determination processing sections;

a second delay element provided for each of (N−1) sets out of N sets of the first and the second carries received by the first to the N-th groups of the addition and determination processing sections, the second delay element having a different delay time for each set; and a third delay element provided for each of (N−1) sets out of N sets of quantized outputs in the first to the M-th addition and determination processing sections in the first to the N-th groups of the addition and determination processing sections, the third delay element having a different delay time for each set.

20. A second-order delta-sigma modulation method, comprising:

a parallel higher-bit processing step of receiving first and second carry outputs from a first accumulator that receives an input bit signal and a second accumulator that receives a sum bit output of the first accumulator as first and second carry inputs, and outputting a quantized output, wherein the parallel higher-bit processing step includes:

first to M-th (M is an integer not less than 2) addition/ determination processing steps, each receiving the first and the second carry inputs and first and second state inputs, and outputting a quantized output and first and second state outputs;

receiving M sets of the first and the second state outputs outputted in the first to the M-th addition/determination processing steps, selecting one set based on a control signal, and outputting the selected set;

receiving M quantized outputs outputted in the first to the M-th addition/determination processing steps, selecting one quantized output according to the delayed control signal, and outputting the selected quantized output; and delaying the first and the second state outputs selected by the first selector and using the delayed signals as the control signal for the first and the second selectors.

* * * * *